United States Patent
Lim et al.

(10) Patent No.: US 7,902,614 B2
(45) Date of Patent: Mar. 8, 2011

(54) SEMICONDUCTOR DEVICE WITH GATE STACK STRUCTURE

(75) Inventors: Kwan-Yong Lim, Ichon-shi (KR);
Hong-Seon Yang, Ichon-shi (KR);
Heung-Jae Cho, Ichon-shi (KR);
Tae-Kyung Kim, Ichon-shi (KR);
Yong-Soo Kim, Ichon-do (KR);
Min-Gyu Sung, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/862,003

(22) Filed: Sep. 26, 2007

(65) Prior Publication Data

US 2008/0157383 A1    Jul. 3, 2008

(30) Foreign Application Priority Data

Dec. 27, 2006 (KR) .................. 10-2006-0134326
Apr. 27, 2007 (KR) .................. 10-2007-0041288

(51) Int. Cl.
*H01L 29/423* (2006.01)
(52) U.S. Cl. ... 257/412; 257/314; 257/316; 257/E29.129
(58) Field of Classification Search .................. 257/314, 257/316, 412, E29.129
See application file for complete search history.

(56) References Cited

U.S. PATENT DOCUMENTS

| | | | |
|---|---|---|---|
| 5,518,958 A | 5/1996 | Giewont et al. | |
| 5,719,410 A | 2/1998 | Suehiro et al. | |
| 5,796,151 A | 8/1998 | Hsu et al. | |
| 5,796,166 A | 8/1998 | Agnello et al. | |
| 5,925,918 A | 7/1999 | Wu et al. | |
| 5,942,356 A | 8/1999 | Mitsui et al. | |
| 5,998,290 A | 12/1999 | Wu et al. | |
| 6,075,274 A | 6/2000 | Wu et al. | |
| 6,107,171 A | 8/2000 | Tsai | |
| 6,208,003 B1 | 3/2001 | Miura | |
| 6,306,743 B1 | 10/2001 | Lee | |
| 6,333,250 B1 | 12/2001 | Kim | |
| 6,376,325 B1 | 4/2002 | Koo | |
| 6,514,842 B1 | 2/2003 | Prall et al. | |
| 6,555,865 B2 * | 4/2003 | Lee et al. ............... | 257/314 |
| 6,688,584 B2 | 2/2004 | Iyer et al. | |
| 6,744,108 B1 | 6/2004 | Pan | |
| 6,800,543 B2 | 10/2004 | Taguwa | |
| 6,872,639 B2 | 3/2005 | DeBoer et al. | |
| 6,875,679 B2 | 4/2005 | Agarwal | |
| 6,902,993 B2 | 6/2005 | Blosse et al. | |
| 6,911,381 B2 | 6/2005 | Agarwal et al. | |
| 6,943,416 B2 | 9/2005 | Hu | |
| 2001/0054729 A1 | 12/2001 | Divakaruni et al. | |

(Continued)

FOREIGN PATENT DOCUMENTS

JP    11-233451    8/1999

(Continued)

*Primary Examiner* — Victor A Mandala
(74) *Attorney, Agent, or Firm* — Kilpatrick Townsend & Stockton LLP

(57) ABSTRACT

A semiconductor device includes a first conductive layer, a first intermediate structure over the first conductive layer, a second intermediate structure over the first intermediate structure, and a second conductive layer over the second intermediate structure. The first intermediate structure includes a metal silicide layer and a nitrogen containing metal layer. The second intermediate structure includes at least a nitrogen containing metal silicide layer.

11 Claims, 20 Drawing Sheets

U.S. PATENT DOCUMENTS

| | | |
|---|---|---|
| 2002/0011636 A1 | 1/2002 | Hayashi et al. |
| 2002/0072156 A1 | 6/2002 | Lee et al. |
| 2003/0043637 A1 | 3/2003 | Forbes et al. |
| 2003/0170942 A1 | 9/2003 | Taguwa |
| 2004/0195603 A1 | 10/2004 | Ito |
| 2004/0207030 A1 | 10/2004 | McTeer |
| 2004/0219746 A1 | 11/2004 | Vaartstra et al. |
| 2005/0074957 A1 | 4/2005 | Ho et al. |
| 2005/0110058 A1 | 5/2005 | Hu |
| 2005/0124127 A1 | 6/2005 | Ho et al. |
| 2006/0024894 A1 | 2/2006 | Hong |
| 2006/0180875 A1 | 8/2006 | Park et al. |
| 2006/0197225 A1* | 9/2006 | Pan et al. ............. 257/757 |
| 2006/0244084 A1 | 11/2006 | Lee et al. |
| 2006/0284264 A1 | 12/2006 | Taguwa |
| 2007/0001241 A1 | 1/2007 | Lim et al. |
| 2007/0001246 A1 | 1/2007 | Lim et al. |
| 2007/0034964 A1 | 2/2007 | Park et al. |
| 2007/0066013 A1 | 3/2007 | Lim et al. |
| 2009/0149033 A1* | 6/2009 | Vaartstra et al. ............. 438/778 |

FOREIGN PATENT DOCUMENTS

| | | |
|---|---|---|
| KR | 1020020002176 A | 1/2002 |
| KR | 1020020008771 A | 1/2002 |
| KR | 1020050033494 A | 4/2005 |
| KR | 100618895 B1 | 8/2006 |

* cited by examiner

SEMICONDUCTOR DEVICE WITH GATE STACK STRUCTURE

CROSS-REFERENCE TO RELATED APPLICATIONS

The present invention claims priority of Korean patent application numbers 10-2006-0134326 and 10-2007-0041288, filed on Dec. 27, 2006 and Apr. 27, 2007, which are incorporated by reference in their entirety.

BACKGROUND OF THE INVENTION

The present invention relates to a semiconductor device, and more particularly, to semiconductor device with a gate stack structure.

A tungsten polysilicon gate electrode formed by stacking polysilicon and tungsten has a very low resistance which is about one fifth to one tenth times smaller than that of a polysilicon/tungsten silicide (Poly-Si/$WSi_x$) gate electrode formed by stacking polysilicon and tungsten silicide. Accordingly, the tungsten polysilicon gate electrode is necessary to fabricate sub-60 nm memory devices.

FIGS. 1A to 1C illustrate typical tungsten polysilicon gate stack structures. As shown in FIG. 1A, the tungsten polysilicon gate stack structure is formed by sequentially stacking a polysilicon layer 11, a tungsten nitride (WN) layer 12, and a tungsten (W) layer 13. The WN layer 12 serves as a diffusion barrier.

During a subsequent annealing process or a gate re-oxidation process, nitrogen in the WN layer 12 is decomposed to a non-uniform insulation layer such as $SiN_x$ and $SiO_xN_y$, between the tungsten layer 13 and the polysilicon layer 11. The non-uniform insulation layer has a thickness ranging from about 2 nm to 3 nm. Accordingly, a device error such as a signal delay may be induced at an operation frequency of several hundreds of megahertz (MHz), and an operation voltage of 1.5 V or less. Recently, a thin tungsten silicide ($WSi_x$) or titanium (Ti) layer has been formed between the polysilicon layer 11 and the WN layer 12 as a diffusion barrier layer to prevent Si—N bonds from being formed between the tungsten layer 13 and the polysilicon layer 11.

As shown in FIG. 1B, if a tungsten silicide ($WSi_x$) layer 14 is formed between the polysilicon layer 11 and the WN layer 12, W—Si—N bonds are formed over the $WSi_x$ layer 14 by nitrogen plasma used during the formation of the WN layer 12. It is well known that W—Si—N is a good diffusion barrier layer with a metallic characteristic.

As shown in FIG. 1C, if a titanium (Ti) layer 15 is formed between the polysilicon layer 11 and the WN layer 12, the nitrogen plasma transforms Ti of the titanium layer 15 to titanium nitride (TiN) in a reactive sputtering process during the formation of the WN layer 12. The TiN layer functions as a diffusion barrier layer. As a result, although the WN layer 12 is decompounded during a subsequent thermal process, the TiN prevents nitrogen from being diffused out towards the polysilicon layer 11 and thus, the formation of Si—N can be effectively reduced.

However, if the tungsten polysilicon gate is applied to a dual polysilicon gate [i.e., an $N^+$-type polysilicon gate for an N-type metal oxide semiconductor field effect transistor (NMOSFET) and a $P^+$-type polysilicon gate for a P-type metal oxide semiconductor field effect transistor (PMOSFET)], contact resistance between the tungsten layer and the $P^+$-type polysilicon layer may be greatly increased if the $WSi_x$/WN diffusion barrier structure is used in the tungsten polysilicon gate. On the contrary, if the Ti/WN diffusion barrier structure is used in the tungsten polysilicon gate, the contact resistance between the tungsten layer and the $P^+$-type polysilicon layer is low regardless of the polysilicon doping species.

In the case of $P^+$-type polysilicon for the PMOSFET, a polysilicon depletion effect may be generated at an inversion state which is an actual operating mode. The generation of the polysilicon depletion effect may depend on the amount of boron remaining inside $P^+$-type polysilicon.

The polysilicon depletion effect may be generated much more in the $WSi_x$/WN diffusion barrier structure than in the Ti/WN diffusion barrier structure. Consequently, the $WSi_x$/WN diffusion barrier structure may degrade the transistor properties. As a result, using the Ti/WN diffusion barrier structure is suggested because the Ti/WN diffusion barrier structure can provide low contact resistance between the tungsten layer and the polysilicon layer, and prevent the generation of P-type polysilicon depletion.

However, if the Ti/WN diffusion barrier structure is used, the sheet resistance (Rs) of W formed directly over the Ti/WN diffusion barrier structure may be increased by about 1.5 to 2 times. Accordingly, the increase in the sheet resistance (Rs) may affect the development of tungsten polysilicon gates in the future.

SUMMARY OF THE INVENTION

Embodiments of the present invention are directed towards a gate stack of a semiconductor device including an intermediate structure, wherein the intermediate structure has low sheet resistance and contact resistance, and can efficiently prevent an out-diffusion of an impurity, and a method for fabricating the same.

In accordance with an aspect of the present invention, there is provided a semiconductor device. The semiconductor device includes a first conductive layer, a first intermediate structure over the first conductive layer, the first intermediate structure comprising a metal silicide layer and a nitrogen containing metal layer, a second intermediate structure over the first intermediate structure, the second intermediate structure including at least a nitrogen containing metal silicide layer, and a second conductive layer over the second intermediate structure.

In accordance with another aspect of the present invention, there is provided a semiconductor device. The semiconductor device includes a first conductive layer, an intermediate structure formed over the first conductive layer and including at least a first metal layer and a nitrogen containing metal silicide layer, and a second conductive layer formed over the intermediate structure.

In accordance with another aspect of the present invention, there is provided a semiconductor device. The semiconductor device includes a first conductive layer, an intermediate structure overlying the first conductive layer and comprising a first metal layer, a second metal layer, a metal silicide layer, and a third metal layer, and a second conductive layer overlying the intermediate structure.

DESCRIPTION OF SPECIFIC EMBODIMENTS

Figure 1A:
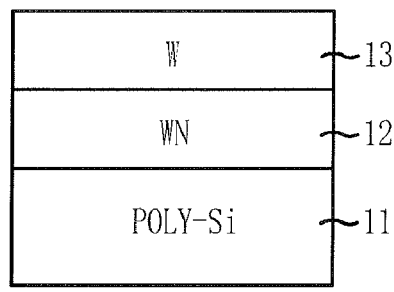
FIGS. 1A to 1C illustrate gate stack structures of typical tungsten polysilicon gates.
Figure 1B:
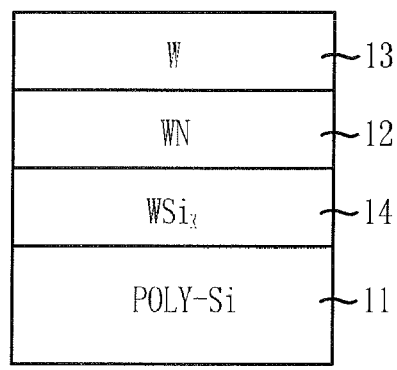
Figure 1C:
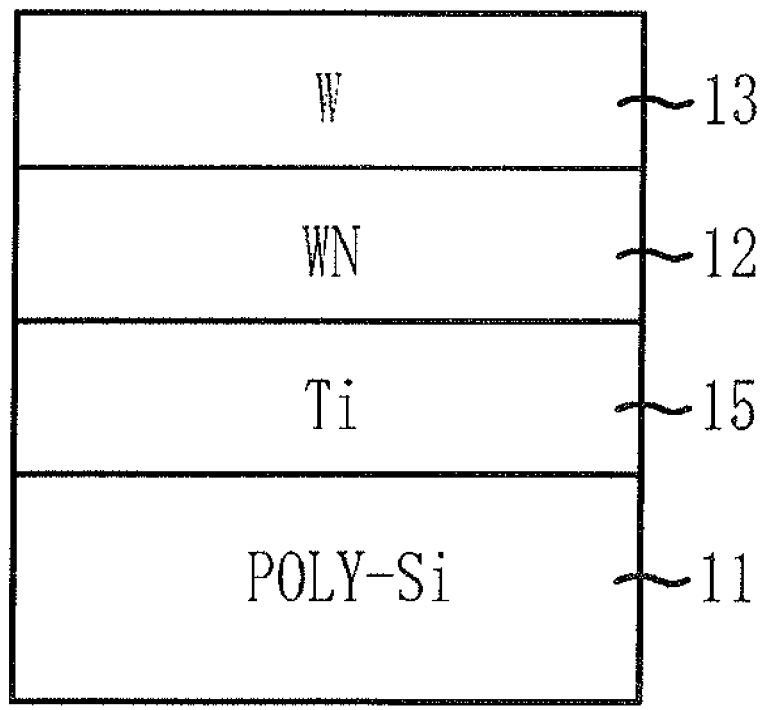
Figure 2A:
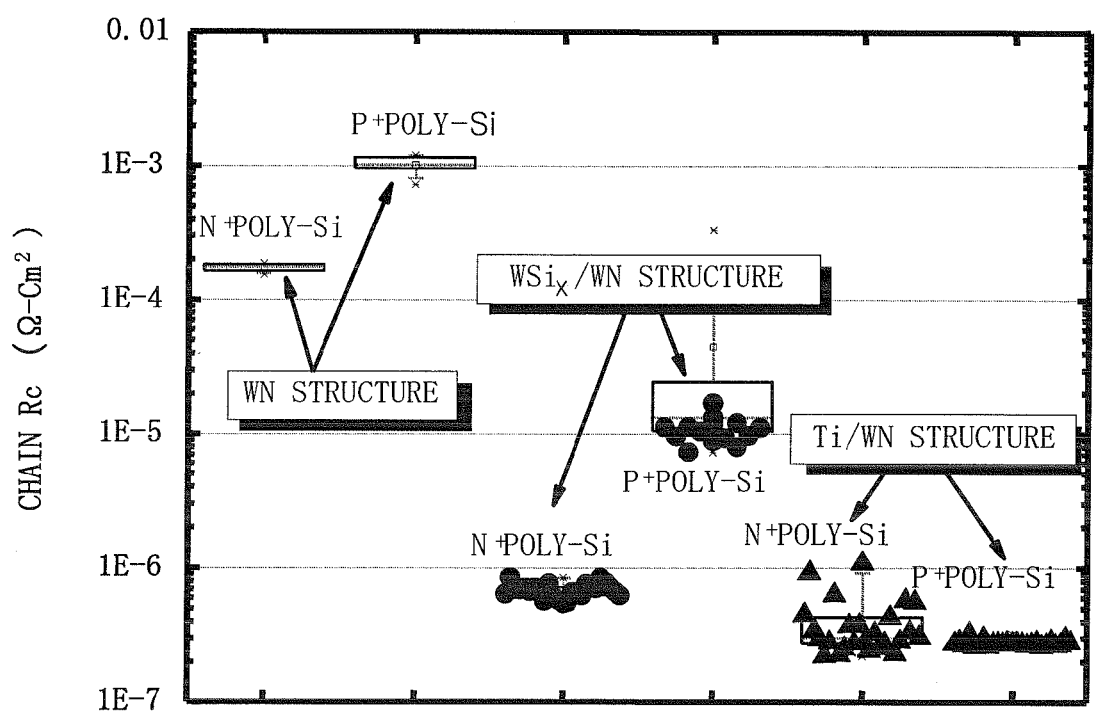
FIG. 2A is a graph illustrating contact resistance between tungsten and polysilicon for each type of intermediate structure.

FIG. 2A is a graph illustrating contact resistance between tungsten and polysilicon for each type of structure serving as a diffusion barrier. It can be observed that the contact resistance, which is labeled as Rc, between polysilicon (N+ POLY-Si) doped with an N-type impurity and tungsten (W) is greatly improved when a tungsten silicide ($WSi_x$)/tungsten nitride (WN) or titanium (Ti)/WN structure is used instead of a tungsten nitride (WN) structure.

However, if the tungsten polysilicon gate is applied to a dual polysilicon gate [i.e., an N+-type polysilicon gate for an N-type metal oxide semiconductor field effect transistor (NMOSFET) and a P+-type polysilicon gate for a P-type metal oxide semiconductor field effect transistor (PMOSFET)], the contact resistance between the W and P+-type polysilicon (P+ POLY-Si) is greatly increased if the $WSi_x$/WN structure is used in the tungsten polysilicon gate. On the contrary, if the Ti/WN structure is used in the tungsten polysilicon gate, the contact resistance between the W and P+-type polysilicon shows a low level regardless of the polysilicon doping species.

In the case of P+-type polysilicon for the PMOSFET, a polysilicon depletion effect can be generated at an inversion state which is an actual operating mode. The generation of the polysilicon depletion effect depends on the amount of boron remaining inside the P+-type polysilicon.

Figure 2B:
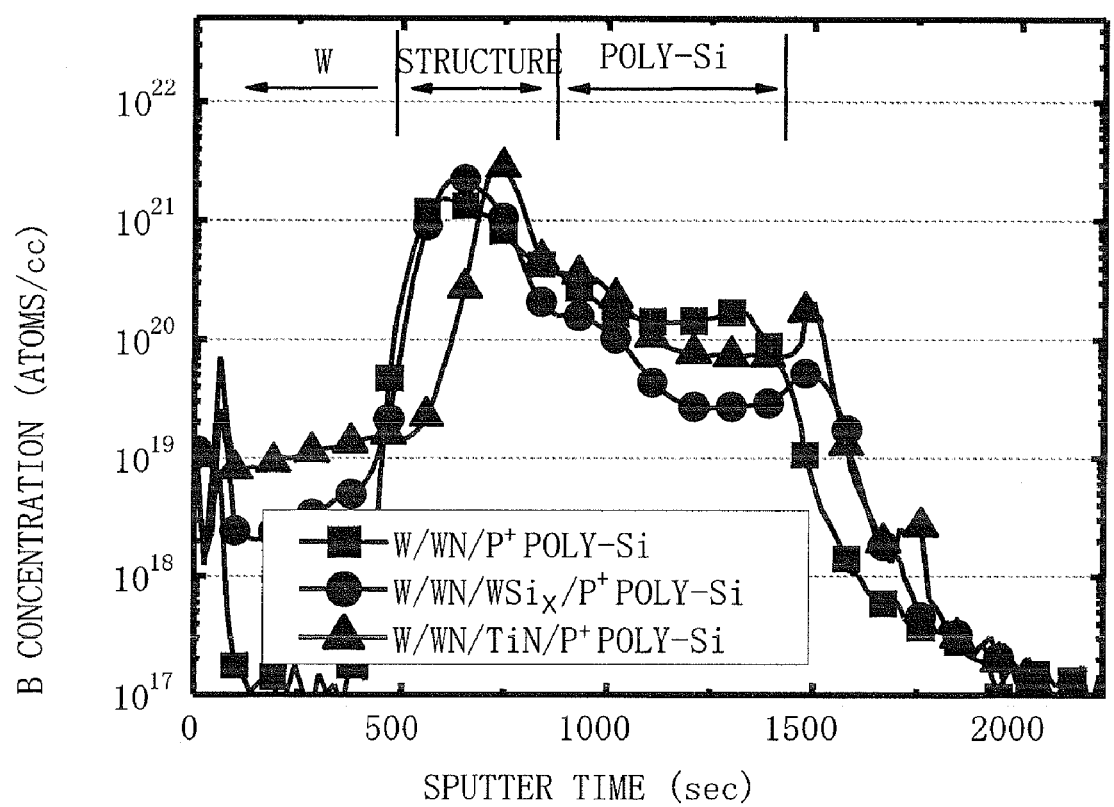
FIG. 2B is a graph illustrating depth profiles of boron concentration for each type of gate stack structure.

FIG. 2B is a graph illustrating depth profiles of boron concentration for each type of gate stack. As illustrated in a $WSi_x$/WN structure, the boron concentration is low at about $5 \times 10^{19}$ atoms/cm$^3$ at the interfacial surface between a gate insulation layer (e.g., oxide layer) and polysilicon. The boron concentration at the same location using a Ti/WN structure is measured at more than about $8 \times 10^{19}$ atoms/cm$^3$. As a result, the polysilicon is depleted more in the $WSi_x$/WN structure than in the Ti/WN structure and consequently, the $WSi_x$/WN structure degrades the transistor properties.

Accordingly, it is better to use the Ti/WN structure which provides low contact resistance between the W and the polysilicon and prevents P-type polysilicon depletion. However, there is a limitation in the application of the Ti/WN structure. The sheet resistance (Rs) of the W formed over the Ti/WN structure is increased by about 1.5 to 2 times. This limitation will be described in more detail in FIG. 2C.

Figure 2C:
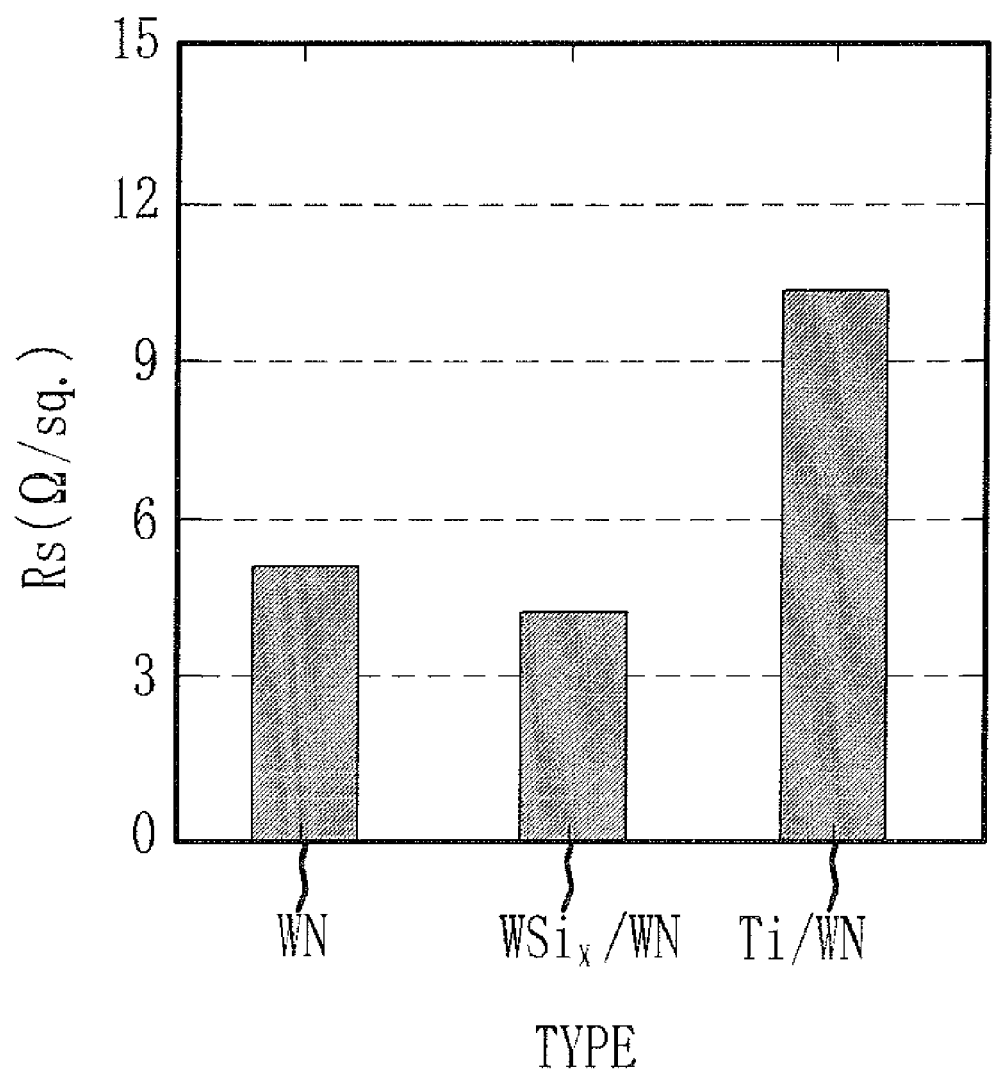
FIG. 2C is a graph illustrating sheet resistance for each type of intermediate structure.

FIG. 2C is a graph illustrating sheet resistance of W for each type of structure functioning as a diffusion barrier. The sheet resistance of W is labeled as Rs. Generally, an amorphous nitrogen containing ($WN_x$) tungsten layer can be formed over a polysilicon layer, a silicon oxide ($SiO_2$) layer, a silicon nitride ($Si_3N_4$) layer, and a $WSi_x$ layer and thus, W having low specific resistance (i.e., in a range of about 15μ Ω-cm to 20μ Ω-cm) can be formed thereon. However, W with a relatively small grain size is formed over Ti, W, and tantalum (Ta) which are polycrystalline pure metals, and titanium nitride (TiN) and tantalum nitride (TaN) which are metal nitride materials. Thus, W having a high specific resistance of about 30μ Ω-cm is formed thereon. The increase in the sheet resistance of W caused by the application of the Ti/WN structure may create a limitation in developing the tungsten polysilicon gate in the future.

In accordance with various embodiments of the present invention which will be described hereinafter, different types of intermediate structures of gate stacks are formed with multiple thin layers including Ti, W, silicon (Si), or nitrogen (N), or multiple thin layers each including N. The intermediate structures function as a diffusion barrier, which can decrease the contact resistance and the sheet resistance, and prevent the penetration and out-diffusion of impurities.

In the following embodiments, the term "layer/structure containing nitrogen or nitrogen containing layer/structure" indicates a nitrided metal layer/structure as well as a metal layer/structure containing a certain content/weight ratio of nitrogen. Also, x in $WSi_xN_y$ represents a ratio of silicon to tungsten, ranging from about 0.5 to 3.0, and y represents a ratio of nitrogen to tungsten silicide, ranging from about 0.01 to 10.00.

Figure 3A:
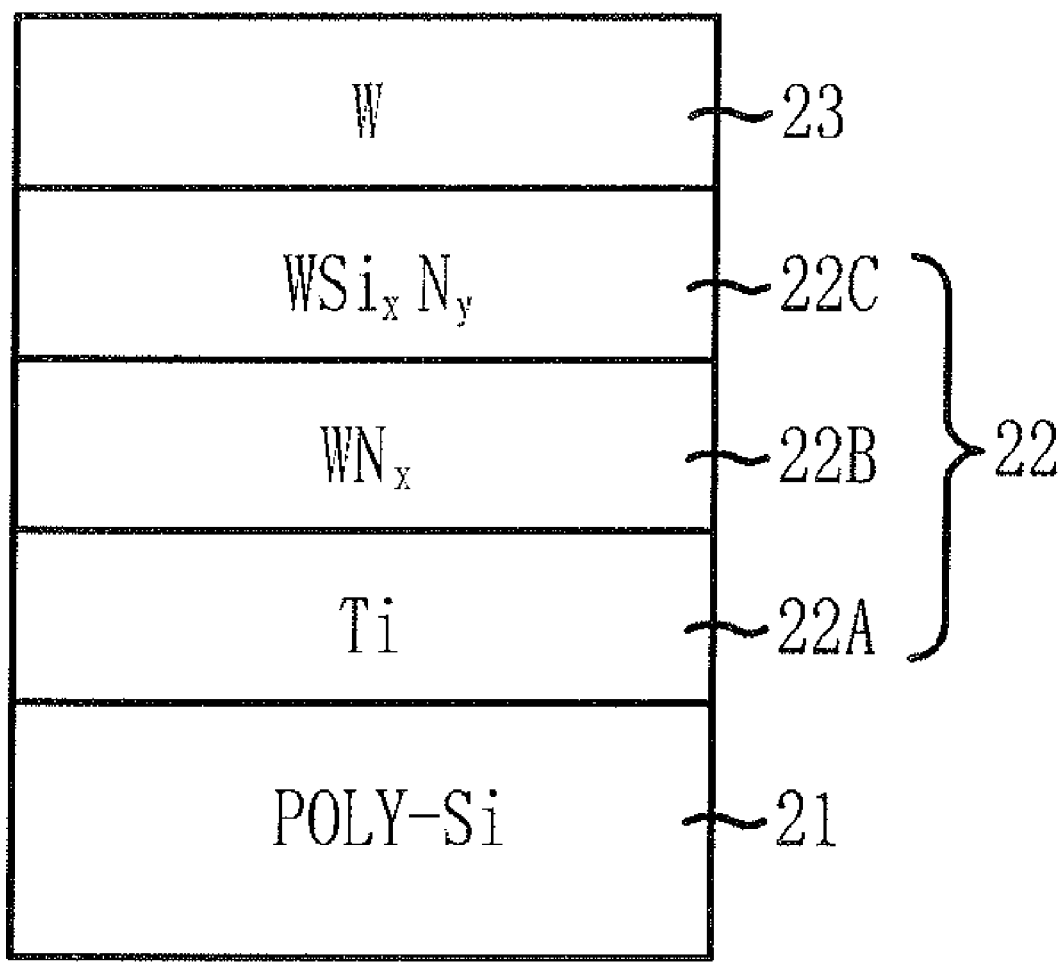
FIG. 3A illustrates a gate stack structure in accordance with a first embodiment of the present invention.

FIG. 3A illustrates a gate stack structure in accordance with a first embodiment of the present invention. The gate stack structure includes a first conductive layer 21, an intermediate structure 22, and a second conductive layer 23, which are formed in sequence. The first conductive layer 21 includes a polysilicon layer that is highly doped with a P-type impurity such as boron or an N-type impurity such as phosphorous. The first conductive layer 21 can also include a polysilicon germanium layer ($Si_{1-x}Ge_x$, where x ranges between about 0.01 and 1.0) or a silicide layer. For instance, the silicide layer includes one selected from a group consisting of nickel (Ni), chromium (Cr), cobalt (Co), titanium (Ti), tungsten (W), tantalum (Ta), hafnium (Hf), zirconium (Zr), and platinum (Pt).

The second conductive layer 23 includes a tungsten layer. The tungsten layer is about 100 Å to 2,000 Å thick, and is formed by performing a physical vapor deposition (PVD) method, a chemical vapor deposition (CVD) method, or an atomic layer deposition (ALD) method. The PVD method includes a sputter deposition method using a tungsten sputter target.

The intermediate structure 22 includes a titanium layer 22A, a nitrogen containing tungsten ($WN_x$) layer 22B, and a nitrogen containing tungsten silicide ($WSi_xN_y$) layer 22C. In detail, a thickness of the titanium layer 22A ranges from about 10 Å to about 80 Å. As mentioned, a ratio of nitrogen to tungsten in the nitrogen containing tungsten layer 22B ranges between about 0.3 to 1.5. The nitrogen containing tungsten layer identifies a tungsten nitride layer or a tungsten layer containing a certain content/weight ratio of nitrogen. Although it will be described in the following third embodiment, the nitrogen containing tungsten layer 22B supplies nitrogen to the nitrogen containing tungsten silicide layer 22C. The nitrogen containing tungsten layer 22B has a thickness of about 20 Å to 200 Å. Due to the supply of nitrogen to the nitrogen containing tungsten silicide layer 22C, after a subsequent annealing treatment, the nitrogen containing tungsten layer 22B becomes a pure tungsten layer or a tungsten layer containing a trace amount of nitrogen.

A ratio of silicon to tungsten in the nitrogen containing tungsten silicide layer 22C ranges between about 0.5 and 3.0, and a nitrogen content of the nitrogen containing tungsten silicide layer 22C ranges from about 10% to about 60%. The nitrogen containing tungsten silicide layer 22C indicates a nitrided tungsten silicide layer (i.e., tungsten silicon nitride layer) or a tungsten silicide layer containing a certain content/weight ratio of nitrogen. The nitrogen containing tungsten silicide layer 22C is formed to a thickness ranging from about 20 Å to about 200 Å.

The titanium layer 22A and the nitrogen containing tungsten layer 22B are formed by performing a PVD method, a CVD method, or an ALD method. The nitrogen containing tungsten silicide layer 22C is formed by performing a PVD method. The PVD method proceeds with a sputter deposition method or a reactive sputter deposition method. For instance, the titanium layer 22A is formed by performing a sputter deposition method with a titanium sputter target. The nitrogen containing tungsten layer 22B is formed by performing a reactive sputter deposition method with a tungsten sputter target in nitrogen gas ambient. The nitrogen containing tungsten silicide layer 22C is formed by performing a reactive sputter deposition method with a tungsten silicide sputter target in nitrogen gas ambient.

In particular, the PVD method such as a reactive sputter deposition method is used to form the nitrogen containing tungsten silicide layer 22C because the nitrogen containing tungsten silicide layer 22C is not easily grown over the nitrogen containing tungsten layer 22B. If the nitrogen containing tungsten silicide layer 22C is formed by performing a CVD method, the nitrogen containing tungsten silicide layer 22C is not grown uniformly over the nitrogen containing tungsten layer 22B, thereby being agglomerated. This agglomeration results because a tungsten oxide ($WO_x$) layer exists over the nitrogen containing tungsten layer 22B, weakening adhesion of the nitrogen containing tungsten silicide layer 22C formed by the CVD method. However, performing the reactive sputter deposition method with the tungsten silicide sputter target in the nitrogen gas ambient allows uniform formation of the nitrogen containing tungsten silicide layer 22C regardless of a bottom layer type.

Figure 3B:
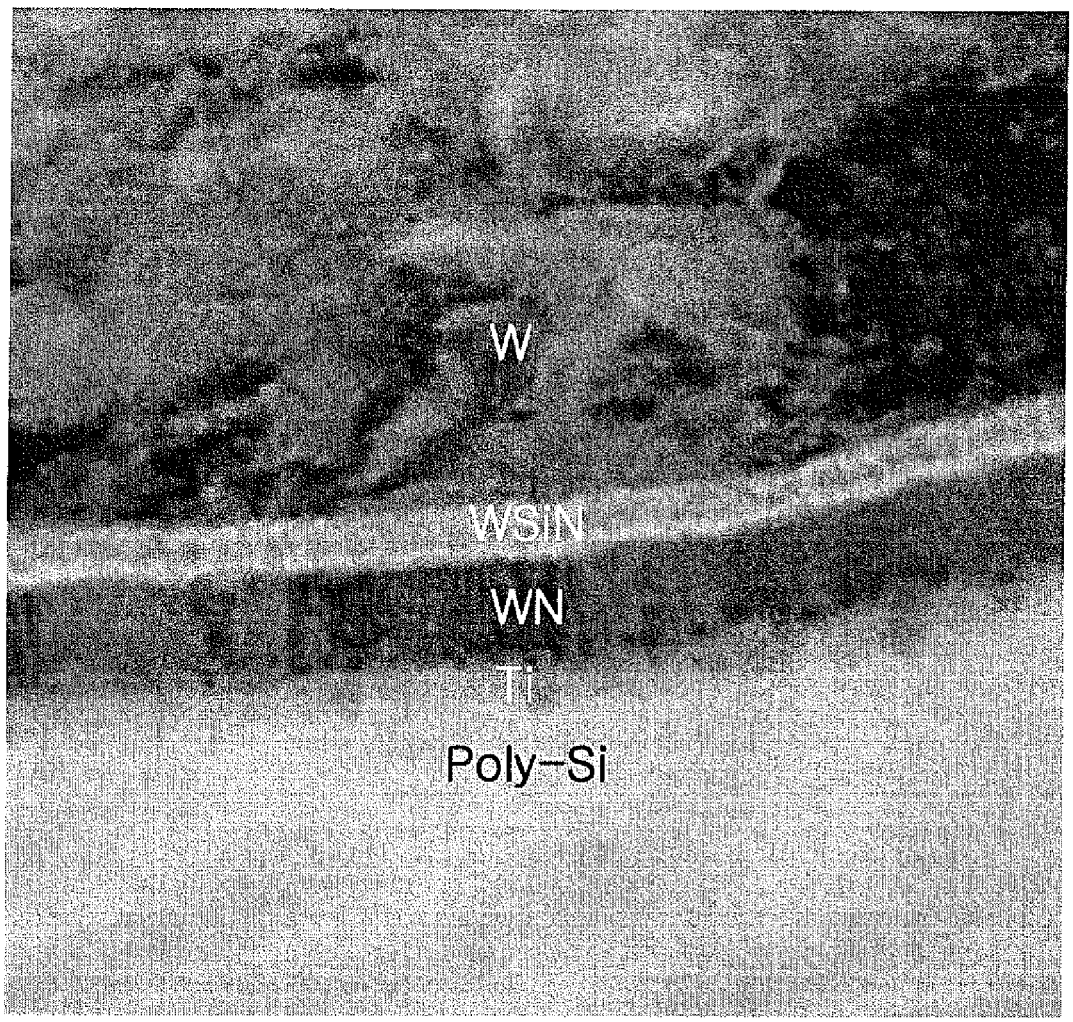
FIG. 3B is an image obtained after forming a tungsten silicon nitride layer over an upper portion of a tungsten nitride layer via a physical vapor deposition (PVD) method.

FIG. 3B illustrates an image obtained after forming a nitrogen containing tungsten silicide layer over a nitrogen containing tungsten layer via a PVD method. A reactive sputter deposition method is employed as the PVD method to form the nitrogen containing tungsten silicide layer uniformly over the nitrogen containing tungsten layer. Reference letters WSiN and WN represent the nitrogen containing tungsten silicide layer and the nitrogen containing tungsten layer, respectively.

According to the first embodiment of the present invention, the gate stack structure includes the first conductive layer 21, the $Ti/WN_x/WSi_xN_y$ intermediate structure and the second conductive layer 23. The first conductive layer 21 includes polysilicon and the second conductive layer 23 includes tungsten, thereby forming a tungsten polysilicon gate stack structure.

In particular, the $Ti/WN_x/WSi_xN_y$ intermediate structure includes a stack structure of a first metal layer, a second metal layer and a metal silicide layer containing nitrogen. More specifically, the first metal layer, the second metal layer and the metal silicide layer containing nitrogen include a pure metal layer, a nitrogen containing metal layer and a nitrogen containing metal silicide layer, respectively. For instance, the first metal layer, the second metal layer and the nitrogen containing metal silicide layer are the titanium layer 22A, the nitrogen containing tungsten ($WN_x$) layer 22B and the nitrogen containing tungsten silicide ($WSi_xN_y$) layer 22C, respectively.

The intermediate structure including multiple layers described as above can be also formed in other various structures. For instance, the first metal layer includes a tantalum (Ta) layer in addition to the titanium layer, and the second metal layer includes a nitrogen containing titanium tungsten layer in addition to the nitrogen containing tungsten layer. The nitrogen containing metal silicide layer includes a nitrogen containing titanium silicide layer or a nitrogen containing tantalum silicide layer in addition to the nitrogen containing tungsten silicide layer. The Ta layer is formed by performing a PVD method including sputtering, a CVD method or an ALD method. The nitrogen containing titanium tungsten layer is formed by performing a reactive sputter deposition method with a titanium tungsten sputter target in nitrogen gas ambient. The nitrogen containing titanium silicide layer and the nitrogen containing tantalum silicide layer are formed by a reactive sputter deposition method with respective titanium silicide and tantalum silicide sputter targets in nitrogen gas ambient. The Ta layer is formed to a thickness of about 10 Å to 80 Å. Each of the nitrogen containing titanium tungsten layer, the nitrogen containing titanium silicide layer and the nitrogen containing tantalum silicide layer is formed to a thickness of about 20 Å to 200 Å, and has a nitrogen content ranging between about 10% and 60%. In the nitrogen containing titanium tungsten layer, a ratio of titanium to tungsten ranges from about 0.5 to 3.0. In the nitrogen containing titanium silicide layer, a ratio of silicon to titanium ranges from about 0.5 to 3.0. In the nitrogen containing tantalum silicide layer, a ratio of silicon to tantalum ranges from about 0.5 to 3.0.

Figure 3C:
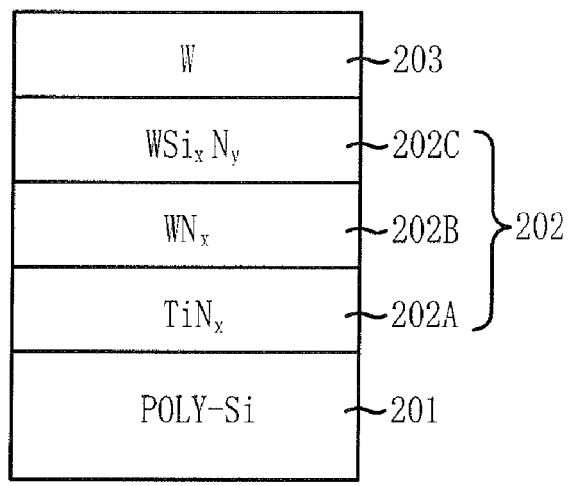
FIG. 3C illustrates a gate stack structure in accordance with a second embodiment of the present invention.

FIG. 3C illustrates a gate stack structure in accordance with a second embodiment of the present invention. Particularly, the gate stack structure is an exemplary gate stack structure modified from the gate stack structure according to the first embodiment of the present invention. In other words, instead of the titanium layer 22A illustrated in FIG. 3A, the gate stack structure includes a nitrogen containing titanium layer, which is identified as $TiN_x$, where x is less than about 1.

The gate stack structure according to the second embodiment includes a first conductive layer 201, an intermediate structure 202 and a second conductive layer 203. The first conductive layer 201 includes a polysilicon layer highly doped with a P-type impurity such as boron (B) or an N-type impurity such as phosphorus (P). In addition to the polysilicon layer, the first conductive layer 201 can also include a polysilicon germanium $(Si_{1-x}Ge_x)$ layer, where x is in a range of about 0.01 to 1.0, or a silicide layer. The silicide layer includes one selected from a group consisting of Ni, Cr, Co, Ti, W, Ta, Hf, Zr, and Pt.

The second conductive layer 203 includes a tungsten layer. The tungsten layer is formed to a thickness of about 100 Å to 2,000 Å, performing one of a PVD method, a CVD method and an ALD method. The PVD method includes a sputter deposition method with a tungsten sputter target.

The intermediate structure 202 includes a nitrogen containing titanium $(TiN_x)$ layer 202A, a nitrogen containing tungsten $(WN_x)$ layer 202B and a nitrogen containing tungsten silicide $(WSi_xN_y)$ layer 202C. In more detail, the nitrogen containing titanium layer 202A has a certain ratio of nitrogen to titanium, for instance, in a range of about 0.2 to 0.8. Different from the titanium layer 22A illustrated in FIG. 3A, the nitrogen containing titanium layer 202A is formed to a thickness of about 10 Å 150 Å. The nitrogen containing titanium layer 202A indicates a titanium nitride layer or a titanium layer containing a certain content/weight ratio of nitrogen.

The nitrogen containing tungsten layer 202B has a certain ratio of nitrogen to tungsten, for instance, in a range of about 0.3 to 1.5. The nitrogen containing tungsten layer 202B indicates a tungsten nitride layer or a tungsten layer containing a certain content/weight ratio of nitrogen. Although described later, the nitrogen containing tungsten layer 202B supplies nitrogen to the nitrogen containing tungsten silicide layer 202C. The nitrogen containing tungsten layer 202B is formed to a thickness of about 20 Å 200 Å. Due to the supply of nitrogen, the nitrogen containing tungsten layer 202B becomes a pure tungsten layer or a tungsten layer containing a trace amount of nitrogen after the annealing.

A ratio of silicon to tungsten in the nitrogen containing tungsten silicide layer 202C ranges between about 0.5 and 3.0, and a nitrogen content of the nitrogen containing tungsten silicide layer 202C ranges from about 10% to about 60%. The nitrogen containing tungsten silicide layer 202C indicates a tungsten silicon nitride layer or a tungsten silicide layer containing a certain content/weight ratio of nitrogen.

The nitrogen containing tungsten layer 202B is formed by performing a PVD method, a CVD method, or an ALD method. The nitrogen containing titanium layer 202A and the nitrogen containing tungsten silicide layer 202C are formed by performing a PVD method. The PVD method proceeds with a sputter deposition method or a reactive sputter deposition method. For instance, the nitrogen containing titanium layer 202A is formed by performing a sputter deposition method with a titanium sputter target in nitrogen gas ambient.

The nitrogen containing tungsten layer 202B is formed by performing a reactive sputter deposition method with a tungsten sputter target in nitrogen gas ambient. The nitrogen containing tungsten silicide layer 202C is formed by performing a reactive sputter deposition method with a tungsten silicide sputter target in nitrogen gas ambient.

In particular, the PVD method such as a reactive sputter deposition method is used to form the nitrogen containing tungsten silicide layer 202C because the nitrogen containing tungsten silicide layer 202C is not easily grown over the nitrogen containing tungsten layer 202B. If the nitrogen containing tungsten silicide layer 202C is formed by performing a CVD method, the nitrogen containing tungsten silicide layer 202C is not grown uniformly over the nitrogen containing tungsten layer 202B, thereby being agglomerated. This agglomeration results because a tungsten oxide $(WO_x)$ layer exists over the nitrogen containing tungsten layer 202B, weakening adhesion of the nitrogen containing tungsten silicide layer 202C formed by the CVD method. However, performing the reactive sputter deposition method with the tungsten silicide sputter target in the nitrogen gas ambient allows uniform formation of the nitrogen containing tungsten silicide layer 202C regardless of a bottom layer type.

Low contact resistance can be obtained when using the nitrogen containing titanium layer 202A in the second embodiment similar to the titanium layer 22A in the first embodiment. The reason for the low contact resistance is because the nitrogen containing tungsten layer 202B formed supplies nitrogen to the nitrogen containing titanium layer 202A, thereby making an upper portion of the nitrogen titanium layer 202A robust, and simultaneously preventing the agglomeration of Ti—Si bonds.

The gate stack structure according to the second embodiment of the present invention includes the first conductive layer 201, the $TiN_x/WN_x/WSi_xN_y$ intermediate structure 202 and the second conductive layer 203. The first conductive layer 201 includes polysilicon and the second conductive layer 203 includes tungsten, thereby forming a tungsten polysilicon gate stack structure.

Particularly, the $TiN_x/WN_x/WSi_xN_y$ intermediate structure 202 is formed in a stack structure including a first metal layer, a second metal layer and a nitrogen containing metal silicide layer. The first and second metal layers are metal layers containing a certain content/weight ratio of nitrogen, and the nitrogen containing metal silicide layer contains a certain content/weight ratio of nitrogen. For instance, the first metal layer is the nitrogen containing titanium layer 202A. The second metal layer is the nitrogen containing tungsten layer 202B. The metal silicide layer is the nitrogen containing tungsten silicide layer 202C.

The multiple-layered intermediate structure as illustrated above can be also formed in other various structures. For instance, the first nitrogen containing metal layer includes a nitrogen containing tantalum $(TaN_x)$ layer in addition to the nitrogen containing titanium layer, and the second nitrogen containing metal layer includes a nitrogen containing titanium tungsten $(TiWN_x)$ layer in addition to the nitrogen containing tungsten layer. The nitrogen containing metal silicide layer includes a nitrogen containing titanium silicide $(TiSi_xN_y)$ layer or a nitrogen containing tantalum silicide layer $(TaSi_xN_y)$ in addition to the nitrogen containing tungsten silicide layer. The nitrogen containing tantalum layer is formed by performing a PVD method including sputtering, a CVD method or an ALD method. The nitrogen containing titanium tungsten layer is formed by performing a reactive sputter deposition method with a titanium tungsten sputter target in nitrogen gas ambient. The nitrogen containing titanium silicide layer and the nitrogen containing tantalum silicide layer are formed by a reactive sputter deposition method with respective titanium silicide and tantalum silicide sputter targets in nitrogen gas ambient. The nitrogen containing tantalum layer is formed to a thickness of about 10 Å to 80 Å. Each of the nitrogen containing titanium tungsten layer, the nitrogen containing titanium silicide layer and the nitrogen containing tantalum silicide layer is formed to a thickness of about 20 Å to 200 Å, and has a nitrogen content ranging between about 10% and 60%. In the nitrogen containing titanium tungsten layer, a ratio of titanium to tungsten ranges from about 0.5 to 3.0. In the nitrogen containing titanium silicide layer, a ratio of silicon to titanium ranges from about 0.5 to 3.0. In the nitrogen containing tantalum silicide layer, a ratio of silicon to tantalum ranges from about 0.5 to 3.0.

Similar to the $TiN_x/WN_x/WSi_xN_y$ intermediate structure, the intermediate structure including the nitrogen containing tantalum layer instead of the nitrogen containing titanium layer can have low contact resistance and sheet resistance and simultaneously prevent a polysilicon depletion. Although the intermediate structure according to the second embodiment is formed in three layers, the intermediate structure may further include a nitrogen containing tungsten ($WN_x$) layer over the nitrogen containing tungsten silicide layer. The additionally provided nitrogen containing tungsten layer has a thickness and a nitrogen content substantially the same as the first provided nitrogen containing tungsten layer. The multiple layers of the $TiN_x/WN_x/WSi_xN_y$ intermediate structure according to the second embodiment include nitrogen. As a result, the $TiN_x/WN_x/WSi_xN_y$ intermediate structure can have the low sheet resistance and contact resistance and reduces the height of the gate stack structure. Also, the $TiN_x/WN_x/WSi_xN_y$ intermediate structure can reduce the polysilicon depletion resulting from out-diffusion of impurities such as boron doped in the first conductive layer 201.

Figure 3D:
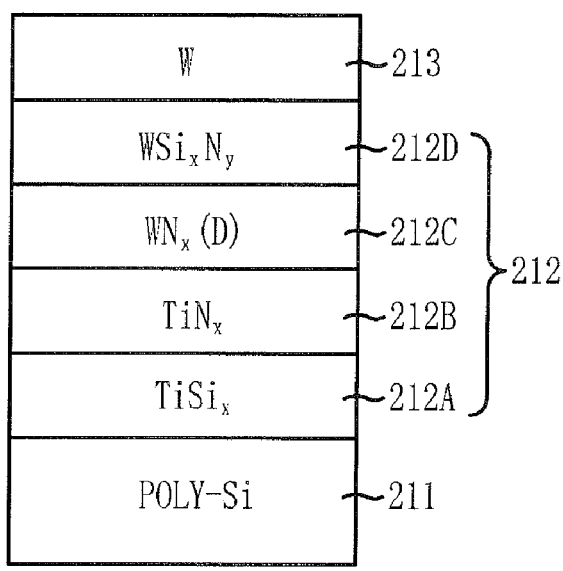
FIG. 3D illustrates a gate stack structure in accordance with a third embodiment of the present invention.

FIG. 3D illustrates a gate stack structure in accordance with a third embodiment of the present invention. The gate stack structure includes a first conductive layer 211, an intermediate structure 212 and a second conductive layer 213. The first conductive layer 211 includes a polysilicon layer highly doped with a P-type impurity such as boron (B) or an N-type impurity such as phosphorus (P). In addition to the polysilicon layer, the first conductive layer 211 can also include a polysilicon germanium ($Si_{1-x}Ge_x$) layer, where x is in a range of about 0.01 to 1.0, or a silicide layer. The silicide layer includes one selected from a group consisting of Ni, Cr, Co, Ti, W, Ta, Hf, Zr, and Pt.

The second conductive layer 213 includes a tungsten layer. The tungsten layer is formed to a thickness of about 100 Å to 2,000 Å, performing one of a PVD method, a CVD method and an ALD method. The PVD method includes a sputter deposition method with a tungsten sputter target.

The intermediate structure 212 includes a titanium silicide ($TiSi_x$) layer 212A, a nitrogen containing titanium ($TiN_x$) layer 212B, a nitrogen containing tungsten ($WN_x$) layer 212C, and a nitrogen containing tungsten silicide ($WSi_xN_y$) layer 212D. According to the intermediate structures 22 and 202 illustrated in the respective first and second embodiments, a tantalum silicide layer, a nitrogen containing tantalum layer, and a nitrogen containing titanium tungsten layer can be also formed in addition to the titanium silicide layer, a nitrogen containing titanium layer, and a nitrogen containing tungsten layer, respectively. Also, a nitrogen containing titanium silicide layer or a nitrogen containing tantalum silicide layer can be also formed in addition to the nitrogen containing tungsten silicide layer.

The gate stack structure according to the third embodiment is a resultant structure provided after performing an annealing treatment on the gate stack structures according to the first and second embodiments of the present invention. The annealing includes a heat treatment accompanied during various processes (e.g., spacer formation and inter-layer insulation layer formation) performed after forming the gate stack structures.

The intermediate structure 212 is compared with the intermediate structure 22 with reference to FIGS. 3A and 3D. The titanium silicide layer 212A is formed as the titanium layer 22A reacts with polysilicon from the first conductive layer 21, and has a thickness of about 1 Å to 30 Å. A ratio of silicon to titanium in the titanium silicide layer 212A is in a range between about 0.5 and 3.0.

The nitrogen containing titanium layer 212B results as the titanium layer 22A is supplied with nitrogen from the nitrogen containing tungsten layer 22B. A thickness of the nitrogen containing titanium layer 212B ranges from about 10 Å to 100 Å, and has a ratio of nitrogen to titanium ranging from about 0.7 to 1.3. Compared with the ratio of nitrogen to titanium in the titanium layer 22A, the ratio of nitrogen to titanium in the nitrogen containing titanium layer 212B increases from about 0 to about 0.7 to 1.3.

After the annealing, the nitrogen containing tungsten layer 212C has a nitrogen content decreased to about 10% or less due to the denudation. Reference symbol $WN_x(D)$ denotes the denuded nitrogen containing tungsten layer. The nitrogen containing tungsten layer 212C is about 20 Å to 200 Å thick. A ratio of nitrogen to tungsten in the nitrogen containing tungsten layer 212C is in a range between about 0.01 and 0.15. Compared with the ratio of nitrogen to tungsten in the nitrogen containing tungsten layer 22C illustrated in FIG. 3A, the ratio of nitrogen to tungsten in the nitrogen containing tungsten layer 212C decreases from the range between about 0.3 and 1.5 to the range between about 0.01 to 0.15.

The nitrogen containing tungsten silicide layer 212D has a thickness and a composition substantially the same as the nitrogen containing tungsten silicide layer 22C. In detail, the nitrogen containing tungsten silicide layer 212D has a ratio of silicon to tungsten ranging from about 0.5 to 3.0 and a nitrogen content ranging between about 10% and 60%. A thickness of the nitrogen containing tungsten silicide layer 212D is in a range between about 20 Å and 200 Å.

The intermediate structure 212 is compared with the intermediate structure 202 with reference to FIGS. 3D and 3C. During the annealing treatment, the nitrogen containing titanium layer 202A is supplied with nitrogen from the nitrogen containing tungsten layer 202B. As a result, the nitrogen containing titanium layer 202A is transformed into the nitrogen containing titanium layer 212B with a minimum reaction with the titanium silicide layer 212A. A thickness of the titanium silicide layer 212A ranges from about 1 Å to 30 Å, and a thickness of the nitrogen containing titanium layer 212B ranges from about 10 Å to 100 Å.

A ratio of nitrogen to titanium in the nitrogen containing titanium layer 212B ranges between about 0.7 and 1.3. Compared with the nitrogen-to-titanium ratio in the nitrogen containing titanium layer 202B, the nitrogen-to-titanium ratio in the nitrogen containing titanium layer 212B increases from the range between about 0.2 to 0.8 to the range between about 0.7 and 1.3.

After the annealing, the nitrogen containing tungsten layer 212C has a nitrogen content decreased to about 10% or less due to the denudation. The nitrogen containing tungsten layer 212C is about 20 Å to 200 Å thick. A ratio of nitrogen to tungsten in the nitrogen containing tungsten layer 212C is in a range between about 0.01 and 0.15. Compared with the ratio of nitrogen to tungsten in the nitrogen containing tungsten layer 202C illustrated in FIG. 3C, the ratio of nitrogen to tungsten in the nitrogen containing tungsten layer 212C decreases from the range between about 0.3 and 1.5 to the range between about 0.01 to 0.15.

The nitrogen containing tungsten silicide layer 212D has a thickness and a composition substantially the same as the nitrogen containing tungsten silicide layer 202C. In detail, the nitrogen containing tungsten silicide layer 212D has a ratio of silicon to tungsten ranging from about 0.5 to 3.0 and a nitrogen content ranging between about 10% and 60%. A thickness of the nitrogen containing tungsten silicide layer 212D is in a range between about 20 Å and 200 Å.

The gate stack structure according to the third embodiment includes a first intermediate structure and a second intermediate structure. The first intermediate structure includes a first metal silicide layer and a first nitrogen containing metal layer, and the second intermediate structure includes a second nitrogen containing metal layer and a second nitrogen containing metal silicide layer. For instance, the first intermediate structure is formed by stacking the titanium silicide layer 212A and the nitrogen containing titanium layer 212B. The second intermediate structure is formed by stacking the nitrogen containing tungsten layer 212C and the nitrogen containing tungsten silicide layer 212D.

Figure 3E:
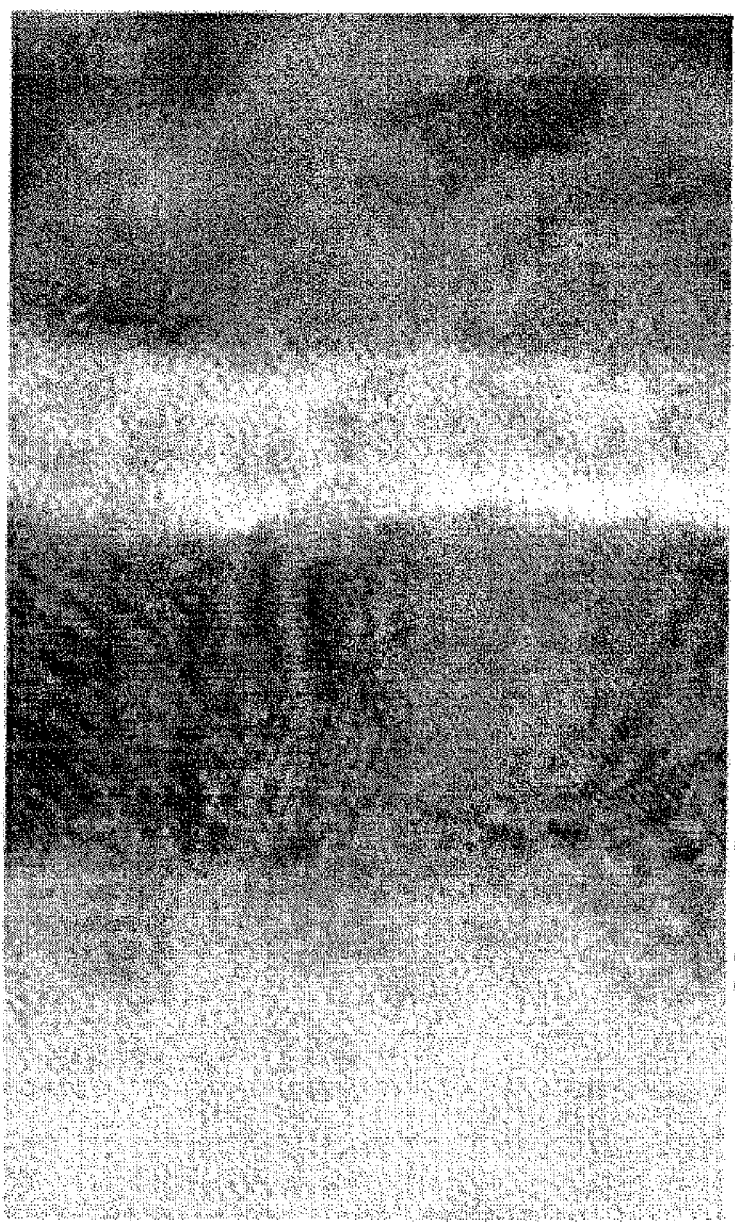
FIG. 3E illustrates an image of a gate stack structure after an annealing process.

FIG. 3E illustrates an image of a gate stack structure after an annealing process. Like reference numerals represent like elements described in the first to third embodiments. Thus, detailed description thereof is omitted.

Figure 4A:
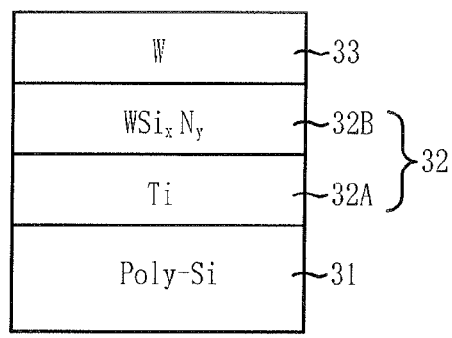
FIG. 4A illustrates a gate stack structure in accordance with a fourth embodiment of the present invention.

FIG. 4A illustrates a gate stack structure in accordance with a fourth embodiment of the present invention. The gate stack structure includes a first conductive layer 31, an intermediate structure 32 and a second conductive layer 33. The first conductive layer 31 includes a polysilicon layer that is highly doped with a P-type impurity such as boron or an N-type impurity such as phosphorous. The first conductive layer 31 can also include a polysilicon germanium layer ($Si_{1-x}Ge_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 33 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 32 includes a titanium layer 32A and a nitrogen containing tungsten silicide ($WSi_xN_y$) layer 32B. In detail, a thickness of the titanium layer 32A ranges from about 10 Å to about 80 Å. The nitrogen containing tungsten silicide layer 32B has a ratio of silicon to tungsten ranging from about 0.5 to 3.0 and a nitrogen content of about 10% to 60%. The nitrogen containing tungsten silicide layer 32B indicates a tungsten silicon nitride layer) or a tungsten silicide layer containing a certain content/weight ratio of nitrogen. The nitrogen containing tungsten silicide layer 32B is formed to a thickness of about 20 Å to 200 Å.

The titanium layer 32A is formed by a PVD method, a CVD method or an ALD method. The nitrogen containing tungsten silicide layer 32B is formed by a PVD method. The PVD method proceeds with a sputter deposition method or a reactive sputter deposition method. For instance, the titanium layer 32A is formed by performing a sputter deposition method with a titanium sputter target. The nitrogen containing tungsten silicide layer 32B is formed by performing a reactive sputter deposition method with a tungsten silicide sputter target in nitrogen gas ambient. In particular, the PVD method such as a reactive sputter deposition method is used to form the nitrogen containing tungsten silicide layer 32B because the nitrogen containing tungsten silicide layer 32B can be formed uniformly regardless of a bottom layer type.

The gate stack structure according to the fourth embodiment of the present invention includes the first conductive layer 31, the $Ti/WSi_xN_y$ intermediate structure 32 and the second conductive layer 33. The first conductive layer 31 includes polysilicon and the second conductive layer 33 includes tungsten, thereby forming a tungsten polysilicon gate stack structure.

In particular, the $Ti/WSI_xN_y$ intermediate structure includes a metal layer and a nitrogen containing metal silicide layer. The metal layer includes a pure metal layer and the metal silicide layer includes a tungsten silicide layer containing nitrogen. For instance, the metal layer is the titanium layer 32A and the metal silicide layer is the nitrogen containing tungsten silicide layer 32B.

The multiple-layered intermediate structure according to the fourth embodiment can be also formed in other structures. The metal layer includes a tantalum layer in addition to the titanium layer, and the nitrogen containing metal silicide layer includes a nitrogen containing titanium silicide ($TiSi_xN_y$) layer or a nitrogen containing tantalum silicide ($TaSi_xN_y$) layer in addition to the nitrogen containing tungsten silicide layer. The tantalum layer is formed by a PVD method including sputter deposition method, a CVD method or an ALD method. The nitrogen containing titanium silicide layer is formed by a reactive sputter deposition method with a titanium silicide sputter target in nitrogen gas ambient. The nitrogen containing tantalum silicide layer is formed by performing a reactive sputter deposition method with a tantalum silicide sputter target in nitrogen gas ambient. The tantalum layer is about 10 Å to 80 Å thick. Each of the nitrogen containing titanium silicide layer and the nitrogen containing tantalum silicide layer is formed to a thickness of about 20 Å to 200 Å and has a nitrogen content of about 10% to 60%. A ratio of silicon to titanium in the nitrogen containing titanium silicide layer ranges between about 0.5 and 3.0. The nitrogen containing tantalum silicide layer has a silicon-to-titanium ratio of about 0.5 to 3.0.

Figure 4B:
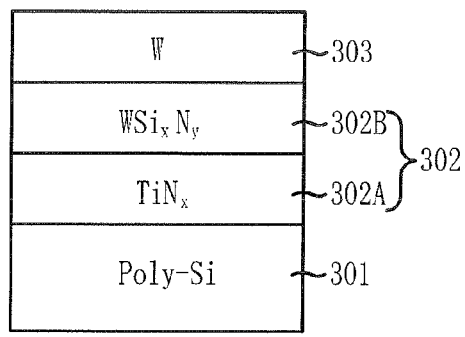
FIG. 4B illustrates a gate stack structure in accordance with a fifth embodiment of the present invention.

FIG. 4B illustrates a gate stack structure in accordance with a fifth embodiment of the present invention. The illustrated gate stack structure is modified from the gate stack structure according to the second embodiment. In other words, instead of titanium, a nitrogen containing titanium ($TiN_x$) layer, where x is less than about 1, is used.

The gate stack structure includes a first conductive layer 301, an intermediate structure 302 and a second conductive layer 303. The first conductive layer 301 includes a polysilicon layer that is highly doped with a P-type impurity such as boron or an N-type impurity such as phosphorous. The first conductive layer 301 can also include a polysilicon germanium layer ($Si_{1-x}Ge_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 303 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 302 includes a nitrogen containing titanium ($TiN_x$) layer 302A and a nitrogen containing tungsten silicide ($WSi_xN_y$) layer 302B. The nitrogen containing titanium layer 302A has a ratio of nitrogen to titanium ranging from about 0.2 to 0.8, and a thickness of about 10 Å to 150 Å. The nitrogen containing titanium layer 302A indicates a titanium nitride layer or a titanium layer containing nitrogen. In the present embodiment, the nitrogen containing titanium layer has a metal property.

The nitrogen containing tungsten silicide layer 302B has a ratio of silicon to tungsten ranging from about 0.5 to 3.0 and a nitrogen content of about 10% to 60%. The nitrogen containing tungsten silicide layer 302B indicates a tungsten silicon nitride layer or a tungsten silicide layer containing a certain content/weight ratio of nitrogen.

The nitrogen containing titanium layer 302A and the nitrogen containing tungsten silicide layer 302B are formed by a PVD method. The PVD method proceeds with a sputter deposition method or a reactive sputter deposition method. For instance, the nitrogen containing titanium layer 302A is formed by a reactive sputter deposition method with a titanium target in nitrogen gas ambient. The nitrogen containing tungsten silicide layer 302B is formed by a reactive sputter deposition method with a tungsten silicide sputter target in nitrogen gas ambient.

The PVD method such as the above described reactive sputter deposition method is employed to form nitrogen containing tungsten silicide layer 302B because the PVD method allows uniform formation of the nitrogen containing tungsten silicide layer 302B regardless of a bottom layer type.

The gate stack structure according to the fifth embodiment includes the first conductive layer 301, the TiN$_x$/WSi$_x$N$_y$ intermediate structure 302 and the second conductive layer 303. The first conductive layer 302 and the second conductive layer 303 include a polysilicon layer and a tungsten layer, respectively. As a result, a tungsten polysilicon gate stack structure is provided.

In particular, the TiN$_x$/WSi$_x$N$_y$ intermediate structure includes a metal layer and a nitrogen containing metal silicide layer. The metal layer includes a metal layer containing a certain content/weight ratio of nitrogen, and the metal silicide layer includes a metal silicide layer containing a certain content/weight ratio of nitrogen. For instance, the metal layer includes the nitrogen containing titanium layer 302A, and the metal silicide layer includes the nitrogen containing tungsten silicide layer 302B.

The multiple-layered intermediate structure according to the fifth embodiment can be formed in other various structures. The nitrogen containing metal layer includes a nitrogen containing tantalum (TaN$_x$) layer in addition to the nitrogen containing titanium layer. The nitrogen containing metal silicide layer includes a nitrogen containing titanium silicide (TiSi$_x$N$_y$) layer or a nitrogen containing tantalum silicide (TaSi$_x$N$_y$) layer in addition to the nitrogen containing tungsten silicide (WSi$_x$N$_y$) layer. The nitrogen containing tantalum layer is formed by a PVD method including a sputter deposition method, a CVD method or an ALD method. The nitrogen containing titanium silicide layer is formed by performing a reactive sputter deposition method with a titanium silicide sputter target in nitrogen gas ambient. The nitrogen containing tantalum silicide layer is formed by performing a reactive sputter deposition method with a tantalum silicide sputter target in nitrogen gas ambient. The nitrogen containing tantalum layer has a thickness ranging between about 10 Å to 80 Å. Each of the nitrogen containing titanium silicide layer and the nitrogen containing tantalum silicide layer is formed to a thickness of about 20 Å to 200 Å, and has a nitrogen content of about 10% to 60%. A ratio of silicon to titanium in the nitrogen containing titanium silicide layer ranges between about 0.5 and 3.0. The nitrogen containing tantalum silicide layer has a ratio of silicon to tantalum ranging from about 0.5 to 3.0.

Figure 4C:
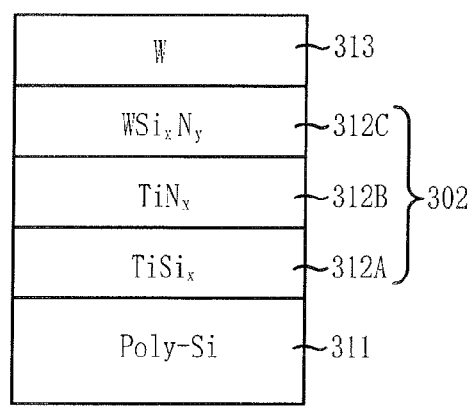
FIG. 4C illustrates a gate stack structure in accordance with a sixth embodiment of the present invention.

FIG. 4C illustrates a gate stack structure in accordance with a sixth embodiment of the present invention. The gate stack structure includes a first conductive layer 311, an intermediate structure 312 and a second conductive layer 313. The first conductive layer 311 includes a polysilicon layer highly doped with a P-type impurity such as boron (B) or an N-type impurity such as phosphorus (P). In addition to the polysilicon layer, the first conductive layer 311 can also include a polysilicon germanium (Si$_{1-x}$Ge$_x$) layer, where x is in a range of about 0.01 to 1.0, or a silicide layer. The silicide layer includes one selected from a group consisting of Ni, Cr, Co, Ti, W, Ta, Hf, Zr, and Pt.

The second conductive layer 313 includes a tungsten layer. The tungsten layer is formed to a thickness of about 100 Å to 2,000 Å, performing one of a PVD method, a CVD method and an ALD method. The PVD method includes a sputter deposition method with a tungsten sputter target.

The intermediate structure 312 includes a titanium silicide (TiSi$_x$) layer 312A, a nitrogen containing titanium (TiN$_x$) layer 312B and a nitrogen containing tungsten silicide (WSi$_x$N$_y$) layer 312C. The intermediate structure can be formed in other various structures depending on the selected materials from the materials described in the fourth and fifth embodiments.

The gate stack structure according to the sixth embodiment is a resultant structure provided after performing an annealing treatment on the gate stack structures according to the fourth and fifth embodiments of the present invention. The annealing includes a heat treatment accompanied during various processes (e.g., spacer formation and inter-layer insulation layer formation) performed after forming the gate stack structures.

In the case where the nitrogen containing tungsten silicide layer 32B is formed over the titanium layer 32A (see FIG. 4A), after the annealing, a trace amount of nitrogen in the nitrogen containing tungsten silicide layer 32B is decomposed in a boundary region between the titanium layer 32A and the nitrogen containing tungsten silicide layer 32B. As a result, as illustrated in FIG. 4C, an upper portion of the titanium layer 32A is transformed into the nitrogen containing titanium layer 312B, and a bottom portion of the titanium layer 32A reacts with polysilicon from the first conductive layer 31 to form the titanium silicide layer 312A.

A thickness of the titanium silicide layer 312A ranges from about 1 Å to 30 Å, and a ratio of silicon to titanium therein ranges between about 0.5 and 3.0. The nitrogen containing titanium layer 312B is about 10 Å to 100 Å thick, and has a ratio of nitrogen to titanium in a range between about 0.7 and 1.3.

The nitrogen containing tungsten silicide layer 312C has a thickness and a composition substantially the same as the nitrogen containing tungsten silicide layer 32B. In detail, the nitrogen containing tungsten silicide layer 312C has a ratio of silicon to tungsten ranging from about 0.5 to 3.0 and a nitrogen content ranging between about 10% and 60%. A thickness of the nitrogen containing tungsten silicide layer 312C is in a range between about 20 Å and 200 Å.

The intermediate structure 312 is compared with the intermediate structure 302 with reference to FIGS. 4C and 4B. During the annealing treatment, the nitrogen containing titanium layer 302A is supplied with nitrogen from the nitrogen containing tungsten silicide layer 302B, thereby being transformed into the nitrogen containing titanium layer 312B with a minimum reaction the titanium silicide layer 312A. A thickness of the titanium silicide layer 312A ranges from about 1 Å to 30 Å, and a thickness of the nitrogen containing titanium layer 312B ranges from about 10 Å to 100 Å. A ratio of nitrogen to titanium within the nitrogen containing titanium layer 312B ranges from about 0.7 to 1.3. Compared with the nitrogen-to-titanium ratio in the nitrogen containing titanium layer 302B (see FIG. 4C), the nitrogen-to-titanium ratio in the nitrogen containing titanium layer 312B increases from the range between about 0.2 to 0.8 to the range between about 0.7 and 1.3.

The nitrogen containing tungsten silicide layer 312C has a thickness and a composition substantially the same as the nitrogen containing tungsten silicide layer 302C. In detail, the nitrogen containing tungsten silicide layer 312C has a ratio of silicon to tungsten ranging from about 0.5 to 3.0 and a nitrogen content ranging between about 10% and 60%. A thickness of the nitrogen containing tungsten silicide layer 312C is in a range between about 20 Å and 200 Å.

The gate stack structure according to the sixth embodiment includes a first intermediate structure and a second intermediate structure. The first intermediate structure includes a metal silicide layer and a nitrogen containing metal layer, and the second intermediate structure includes a nitrogen containing metal silicide layer. For instance, the first intermediate structure is formed by stacking the titanium silicide layer 312A and the nitrogen containing titanium layer 312B. The second intermediate structure includes the nitrogen containing tungsten silicide layer 312C.

Figure 5A:
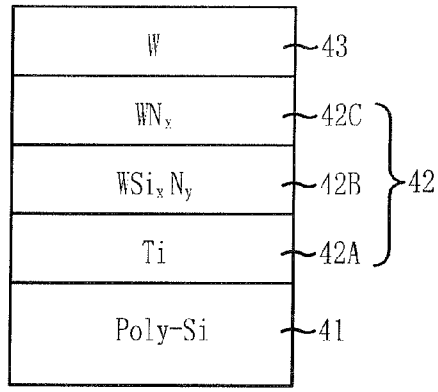
FIG. 5A illustrates a gate stack structure in accordance with a seventh embodiment of the present invention.

FIG. 5A illustrates a gate stack structure in accordance with a seventh embodiment of the present invention. The gate stack structure includes a first conductive layer 41, an intermediate structure 42 and a second conductive layer 43. The first conductive layer 41 includes a polysilicon layer that is highly doped with a P-type impurity such as boron or an N-type impurity such as phosphorous. The first conductive layer 41 can also include a polysilicon germanium layer ($Si_{1-x}Ge_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 43 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 42 includes a titanium layer 42A, a nitrogen containing tungsten silicide ($WSi_xN_y$) layer 42B, and a nitrogen containing tungsten ($WN_x$) layer 42C. In detail, a thickness of the titanium layer 42A ranges from about 10 Å to about 80 Å. The nitrogen containing tungsten silicide layer 42B has a ratio of silicon to tungsten ranging from about 0.5 to 3.0 and a nitrogen content of about 10% to 60%. The nitrogen containing tungsten silicide layer 42B indicates a tungsten silicon nitride layer or a tungsten silicide layer containing a certain content/weight ratio of nitrogen. The nitrogen containing tungsten silicide layer 32B is formed to a thickness of about 20 Å to 200 Å.

A ratio of nitrogen to tungsten in the nitrogen containing tungsten layer 42C ranges between about 0.3 and 1.5. The nitrogen containing tungsten layer 42C indicates a tungsten nitride layer or a tungsten layer containing a certain content/weight ratio of nitrogen. A thickness of the nitrogen containing tungsten layer 42C ranges from about 20 Å to 200 Å. Although it will be described later, the nitrogen containing tungsten layer 42C supplies nitrogen to the nitrogen containing tungsten silicide layer 42B. Thus, after the annealing, the nitrogen containing tungsten layer 42C becomes a pure tungsten layer with no nitrogen or a tungsten layer containing a trace amount of nitrogen.

The titanium layer 42A and the nitrogen containing tungsten layer 42C are formed by performing a PVD method, a CVD method, or an ALD method. The nitrogen containing tungsten silicide layer 42B is formed by performing a PVD method.

The PVD method proceeds with a sputter deposition method or a reactive sputter deposition method. For instance, the titanium layer 42A is formed by performing a sputter deposition method with a titanium sputter target. The nitrogen containing tungsten layer 42C is formed by performing a reactive sputter deposition method with a tungsten sputter target in nitrogen gas ambient. The nitrogen containing tungsten silicide layer 42B is formed by performing a reactive sputter deposition method with a tungsten silicide sputter target in nitrogen gas ambient. In particular, the PVD method such as a reactive sputter deposition method is used to form the nitrogen containing tungsten silicide layer 42B because the above described reactive sputter deposition method with the tungsten silicide sputter target in the nitrogen gas ambient allows uniform formation of the nitrogen containing tungsten silicide layer 42B regardless of a bottom layer type.

The gate stack structure according to the seventh embodiment of the present invention includes the first conductive layer 41, the $Ti/WSi_xN_y/WN_x$ intermediate structure 42 and the second conductive layer 43. The first conductive layer 41 includes polysilicon and the second conductive layer 43 includes tungsten, thereby forming a tungsten polysilicon gate stack structure.

In particular, the $Ti/WSI_xN_y/WN_x$ intermediate structure includes a first metal layer, a nitrogen containing metal silicide layer and a second metal layer. The first metal layer includes a pure metal layer. The second metal layer includes a nitrogen containing metal layer. The metal silicide layer includes a nitrogen containing metal silicide layer. For instance, the first metal layer is the titanium layer 42A. The second metal layer is the nitrogen containing tungsten layer 42C. The metal silicide layer is the nitrogen containing tungsten silicide layer 42B.

The multiple-layered intermediate structure according to the seventh embodiment can be also formed in other structures. The first metal layer includes a tantalum layer in addition to the titanium layer. The second metal layer includes a nitrogen containing titanium tungsten ($TiWN_x$) layer in addition to the nitrogen containing tungsten layer. The metal silicide layer includes a nitrogen containing titanium silicide ($TiSi_xN_y$) layer or a nitrogen containing tantalum silicide ($TaSi_xN_y$) layer in addition to the nitrogen containing tungsten silicide layer. The tantalum layer is formed by a PVD method including sputter deposition method, a CVD method or an ALD method. The nitrogen containing titanium tungsten layer is formed by a reactive sputtering with a titanium tungsten sputter target in nitrogen gas ambient. The nitrogen containing titanium silicide layer is formed by a reactive sputter deposition method with a titanium silicide sputter target in nitrogen gas ambient. The nitrogen containing tantalum silicide layer is formed by performing a reactive sputter deposition method with a tantalum silicide sputter target in nitrogen gas ambient. The tantalum layer is about 10 Å to 80 Å thick. Each of the nitrogen containing titanium tungsten layer and the nitrogen containing tantalum silicide layer is formed to a thickness of about 20 Å to 200 Å and has a nitrogen content of about 10% to 60%. The nitrogen containing titanium tungsten layer has a ratio of titanium to tungsten ranging between about 0.5 and 3.0. A ratio of silicon to titanium in the nitrogen containing titanium silicide layer ranges between about 0.5 and 3.0. The nitrogen containing tantalum silicide layer has a silicon-to-titanium ratio of about 0.5 to 3.0.

Figure 5B:
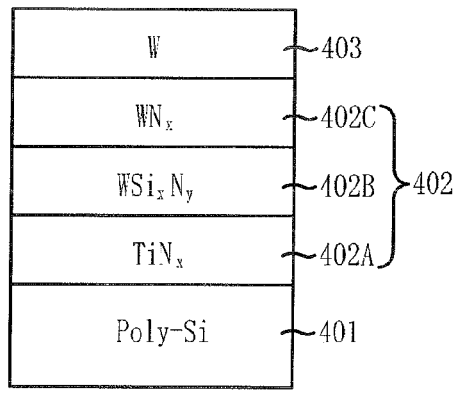
FIG. 5B illustrates a gate stack structure in accordance with an eighth embodiment of the present invention.

FIG. 5B illustrates a gate stack structure in accordance with an eighth embodiment of the present invention. The gate stack structure includes a first conductive layer 401, an intermediate structure 402 and a second conductive layer 403. The first conductive layer 401 includes a polysilicon layer that is highly doped with a P-type impurity such as boron or an N-type impurity such as phosphorous. The first conductive layer 401 can also include a polysilicon germanium layer ($Si_{1-x}Ge_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 403 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 402 includes a nitrogen containing titanium ($TiN_x$) layer 402A, a nitrogen containing tungsten silicide ($WSi_xN_y$) layer 402B and a nitrogen containing tungsten ($WN_x$) layer 402C. In more detail, the nitrogen containing titanium layer 402A has a certain ratio of nitrogen to titanium, for instance, in a range of about 0.2 to 0.8. The nitrogen containing titanium layer 402A is formed to a thickness of about 10 Å 150 Å. The nitrogen containing titanium layer 402A also includes a titanium nitride layer.

A ratio of silicon to tungsten in the nitrogen containing tungsten silicide layer 402B ranges between about 0.5 and 3.0, and a nitrogen content of the nitrogen containing tungsten silicide layer 402B ranges from about 10% to 60%. The nitrogen containing tungsten silicide layer 402B also includes a tungsten silicon nitride layer or a tungsten silicide layer containing a certain content/weight ratio of nitrogen.

The nitrogen containing tungsten layer 402C has a certain ratio of nitrogen to tungsten, for instance, in a range of about 0.3 to 1.5. The nitrogen containing tungsten layer 402C indicates a tungsten nitride layer or a tungsten layer containing a certain content/weight ratio of nitrogen. Although described later, the nitrogen containing tungsten layer 402C supplies nitrogen to the nitrogen containing tungsten silicide layer 402B. The nitrogen containing tungsten layer 402C is formed to a thickness of about 20 Å 200 Å. Due to the supply of nitrogen, the nitrogen containing tungsten layer 402C becomes a pure tungsten layer or a tungsten layer containing a trace amount of nitrogen after the annealing.

The nitrogen containing tungsten layer 402C is formed by performing a PVD method, a CVD method, or an ALD method. The nitrogen containing titanium layer 402A and the nitrogen containing tungsten silicide layer 402B are formed by performing a PVD method.

The PVD method proceeds with a sputter deposition method or a reactive sputter deposition method. For instance, the nitrogen containing titanium layer 402A is formed by performing a sputter deposition method with a titanium sputter target in nitrogen gas ambient. The nitrogen containing tungsten layer 402C is formed by performing a reactive sputter deposition method with a tungsten sputter target in nitrogen gas ambient. The nitrogen containing tungsten silicide layer 402B is formed by performing a reactive sputter deposition method with a tungsten silicide sputter target in nitrogen gas ambient. In particular, the PVD method such as a reactive sputter deposition method is used to form the nitrogen containing tungsten silicide layer 402B because the nitrogen containing tungsten silicide layer 402B can be formed uniformly regardless of a bottom layer type.

The gate stack structure according to the eighth embodiment of the present invention includes the first conductive layer 401, the $TiN_x/WSi_xN_y/WN_x$ intermediate structure 402 and the second conductive layer 403. The first conductive layer 401 includes polysilicon and the second conductive layer 403 includes tungsten, thereby forming a tungsten polysilicon gate stack structure.

Particularly, the $TiN_x/WSi_xN_y/WN_x$/intermediate structure 402 is formed in a stack structure including a first metal layer, a nitrogen containing metal silicide layer and a second metal layer. The first and second metal layers are nitrogen containing metal layers, and the metal silicide layer is a metal silicide layer containing nitrogen. For instance, the first metal layer is the nitrogen containing titanium layer 402A. The second metal layer is the nitrogen containing tungsten layer 402C. The metal silicide layer is a nitrogen containing tungsten silicide layer 402B.

The multiple-layered intermediate structure as illustrated above can be also formed in other various structures. For instance, the first nitrogen containing metal layer includes a nitrogen containing tantalum layer in addition to the nitrogen containing titanium layer. The second nitrogen containing metal layer includes a nitrogen containing titanium tungsten layer in addition to the nitrogen containing tungsten layer. The nitrogen containing metal silicide layer includes a nitrogen containing titanium silicide layer or a nitrogen containing tantalum silicide layer in addition to the nitrogen containing tungsten silicide layer. The nitrogen containing tantalum layer is formed by performing a PVD method including sputtering, a CVD method or an ALD method. The nitrogen containing titanium tungsten layer is formed by performing a reactive sputter deposition method with a titanium tungsten sputter target in nitrogen gas ambient. The nitrogen containing titanium silicide layer and the nitrogen containing tantalum silicide layer are formed by a reactive sputter deposition method with respective titanium silicide and tantalum silicide sputter targets in nitrogen gas ambient. The nitrogen containing tantalum layer is formed to a thickness of about 10 Å to 80 Å. Each of the nitrogen containing titanium tungsten layer, the nitrogen containing titanium silicide layer and the nitrogen containing tantalum silicide layer is formed to a thickness of about 20 Å to 200 Å, and has a nitrogen content ranging between about 10% and 60%. In the nitrogen containing titanium tungsten layer, a ratio of titanium to tungsten ranges from about 0.5 to 3.0. In the nitrogen containing titanium silicide layer, a ratio of silicon to titanium ranges from about 0.5 to 3.0. In the nitrogen containing tantalum silicide layer, a ratio of silicon to tantalum ranges from about 0.5 to 3.0.

Figure 5C:
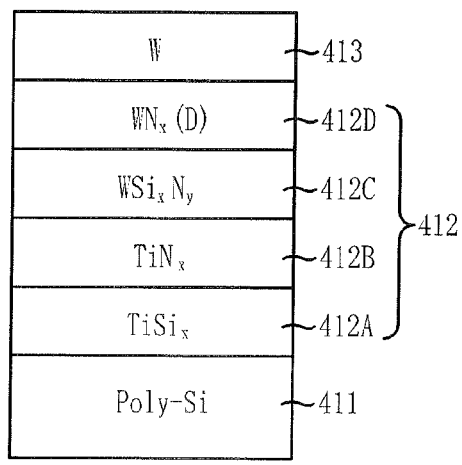
FIG. 5C illustrates a gate stack structure in accordance with a ninth embodiment of the present invention.

FIG. 5C illustrates a gate stack structure in accordance with a ninth embodiment of the present invention. The gate stack structure includes a first conductive layer 411, an intermediate structure 412 and a second conductive layer 413. The first conductive layer 411 includes a polysilicon layer highly doped with a P-type impurity such as boron (B) or an N-type impurity such as phosphorus (P). In addition to the polysilicon layer, the first conductive layer 411 can also include a polysilicon germanium ($Si_{1-x}Ge_x$) layer, where x is in a range of about 0.01 to 1.0, or a silicide layer. The silicide layer includes one selected from a group consisting of Ni, Cr, Co, Ti, W, Ta, Hf, Zr, and Pt.

The second conductive layer 413 includes a tungsten layer. The tungsten layer is formed to a thickness of about 100 Å to 2,000 Å, performing one of a PVD method, a CVD method and an ALD method. The PVD method includes a sputter deposition method with a tungsten sputter target.

The intermediate structure 412 includes a titanium silicide (TiSi$_x$) layer 412A, a nitrogen containing titanium (TiN$_x$) layer 412B, a nitrogen containing tungsten silicide (WSi$_x$N$_y$) layer 412C, and a nitrogen containing tungsten (WN$_x$) layer 412D. The intermediate structure 412 can be formed in various structures according to the selected materials described in the seventh and eighth embodiments of the present invention.

The gate stack structure according to the ninth embodiment is a resultant structure provided after performing an annealing treatment on the gate stack structures according to the seventh and eighth embodiments of the present invention. The annealing includes a heat treatment accompanied during various processes (e.g., spacer formation and inter-layer insulation layer formation) performed after forming the gate stack structures.

The intermediate structure 412 is compared with the intermediate structure 42 with reference to FIGS. 5C and 5A. The titanium silicide layer 412A is formed as the titanium layer 42A reacts with polysilicon from the first conductive layer 41, and has a thickness of about 1 Å to 30 Å. A ratio of silicon to titanium in the titanium silicide layer 212A is in a range between about 0.5 and 3.0.

The nitrogen containing titanium layer 412B results as the titanium layer 42A is supplied with nitrogen from the nitrogen containing tungsten layer 42B. A thickness of the nitrogen containing titanium layer 412B ranges from about 10 Å to 100 Å, and has a ratio of nitrogen to titanium ranging from about 0.7 to 1.3. Compared with the ratio of nitrogen to titanium in the titanium layer 42A, the ratio of nitrogen to titanium in the nitrogen containing titanium layer 412B increases from about 0 to about 0.7 to 1.3.

The nitrogen containing tungsten silicide layer 412C has a thickness and a composition substantially the same as the nitrogen containing tungsten silicide layer 42C. In detail, the nitrogen containing tungsten silicide layer 412C has a ratio of silicon to tungsten ranging from about 0.5 to 3.0 and a nitrogen content ranging between about 10% and 60%. A thickness of the nitrogen containing tungsten silicide layer 412C is in a range between about 20 Å and 200 Å.

After the annealing, the nitrogen containing tungsten layer 412D has a nitrogen content decreased to about 10% or less due to the denudation. Reference symbol WN$_x$(D) denotes the denuded nitrogen containing tungsten layer. The nitrogen containing tungsten layer 412D is about 20 Å to 200 Å thick. A ratio of nitrogen to tungsten in the nitrogen containing tungsten layer 412D is in a range between about 0.01 and 0.15. Compared with the ratio of nitrogen to tungsten in the nitrogen containing tungsten layer 42C illustrated in FIG. 5A, the ratio of nitrogen to tungsten in the nitrogen containing tungsten layer 412D decreases from the range between about 0.3 and 1.5 to the range between about 0.01 to 0.15.

In the case where the nitrogen containing tungsten silicide layer 42B is formed over the titanium layer 42A (see FIG. 5A), after the annealing, a trace amount of nitrogen in the nitrogen containing tungsten silicide layer 42B is decomposed in a boundary region between the titanium layer 42A and the nitrogen containing tungsten silicide layer 42B. As a result, as illustrated in FIG. 5C, an upper portion of the titanium layer 42A is transformed into the nitrogen containing titanium layer 412B, and a bottom portion of the titanium layer 42A reacts with polysilicon from the first conductive layer 41 to form the titanium silicide layer 412A.

The intermediate structure 412 is compared with the intermediate structure 402 with reference to FIGS. 5C and 5B. The nitrogen containing titanium layer 402A is transformed into the nitrogen containing titanium layer 412B with a minimum reaction with the titanium silicide layer 412A. A thickness of the titanium silicide layer 412A ranges from about 1 Å to 30 Å, and a thickness of the nitrogen containing titanium layer 412B ranges from about 10 Å to 100 Å. A ratio of nitrogen to titanium in the nitrogen containing titanium layer 412B ranges between about 0.7 and 1.3. The nitrogen containing tungsten silicide layer 412C has a thickness and composition substantially the same as the nitrogen containing tungsten silicide layer 42B. More specifically, a ratio of silicon to tungsten in the nitrogen containing tungsten silicide layer 412C ranges from about 0.5 to 3.0. the nitrogen containing tungsten silicide layer 412C has a nitrogen content ranging from about 10% to 60%, and is formed to a thickness of about 20 Å to 200 Å.

After the annealing, the nitrogen containing tungsten layer 412D has a nitrogen content decreased to about 10% or less due to the denudation. The nitrogen containing tungsten layer 412D is about 20 Å to 200 Å thick. A ratio of nitrogen to tungsten in the nitrogen containing tungsten layer 412D is in a range between about 0.01 and 0.15.

The gate stack structure according to the ninth embodiment includes a first intermediate structure and a second intermediate structure. The first intermediate structure includes a first metal silicide layer and a first nitrogen containing metal layer, and the second intermediate structure includes a second nitrogen containing metal layer and a nitrogen containing metal silicide layer. For instance, the first intermediate structure is formed by stacking the titanium silicide layer 412A and the nitrogen containing titanium layer 412B. The second intermediate structure is formed by stacking the nitrogen containing tungsten silicide layer 412C and the nitrogen containing tungsten layer 412C.

Figure 6A:
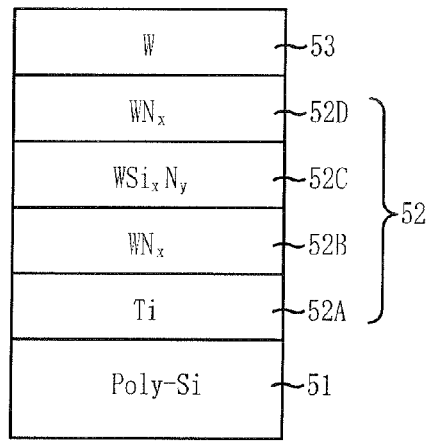
FIG. 6A illustrates a gate stack structure in accordance with a tenth embodiment of the present invention.

FIG. 6A illustrates a gate stack structure in accordance with a tenth embodiment of the present invention. The gate stack structure includes a first conductive layer 51, an intermediate structure 52 and a second conductive layer 53. The first conductive layer 51 includes a polysilicon layer that is highly doped with a P-type impurity such as boron or an N-type impurity such as phosphorous. The first conductive layer 51 can also include a polysilicon germanium layer (Si$_{1-x}$Ge$_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 53 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 52 includes a titanium (Ti) layer 52A, a first nitrogen containing tungsten (WN$_x$) layer 52B, and a nitrogen containing tungsten silicide (WSi$_x$N$_y$) layer 52C, and a second nitrogen containing tungsten (WN$_x$) layer 52D. In detail, a thickness of the titanium layer 52A ranges from about 10 Å to about 80 Å. A ratio of nitrogen to tungsten in each of the first and second nitrogen containing tungsten layer 52B and 52D ranges between about 0.3 and 1.5. Each of the first and second nitrogen containing tungsten layers identifies a tungsten nitride layer or a tungsten layer containing a certain content/weight ratio of nitrogen. Although it will be described later, the first and second nitrogen containing tungsten layers 52B and 52D supply nitrogen to the nitrogen containing tungsten silicide layer 52C. Each of the first and second nitrogen containing tungsten layers 52B and 52D has a thickness of about 20 Å to 200 Å. Due to the supply of nitrogen to the nitrogen containing tungsten silicide layer 52C, after a subsequent annealing treatment, the first and second nitrogen containing tungsten layers 52B and 52D each become a pure tungsten layer or a tungsten layer containing a trace amount of nitrogen.

A ratio of silicon to tungsten in the nitrogen containing tungsten silicide layer 52C ranges between about 0.5 and 3.0, and a nitrogen content of the nitrogen containing tungsten silicide layer 52C ranges from about 10% to about 60%. The nitrogen containing tungsten silicide layer 52C indicates a tungsten silicon nitride layer or a tungsten silicide layer containing a certain content/weight ratio of nitrogen. The nitrogen containing tungsten silicide layer 52C is formed to a thickness ranging from about 20 Å to about 200 Å.

The titanium layer 52A and the first and second nitrogen containing tungsten layers 52B and 52D are formed by performing a PVD method, a CVD method, or an ALD method. The nitrogen containing tungsten silicide layer 52C is formed by performing a PVD method. The PVD method proceeds with a sputter deposition method or a reactive sputter deposition method. For instance, the titanium layer 52A is formed by performing a sputter deposition method with a titanium sputter target. The first and second nitrogen containing tungsten layer 52B and 52D are formed by performing a reactive sputter deposition method with a tungsten sputter target in nitrogen gas ambient. The nitrogen containing tungsten silicide layer 52C is formed by performing a reactive sputter deposition method with a tungsten silicide sputter target in nitrogen gas ambient. In particular, the PVD method such as a reactive sputter deposition method is used to form the nitrogen containing tungsten silicide layer 502C because the nitrogen containing tungsten silicide layer 502C can be formed uniformly regardless of a bottom layer type.

The gate stack structure according to the tenth embodiment includes the first conductive layer 51, the Ti/WN$_x$/WSi$_x$N$_y$/WN$_x$ intermediate structure 52 and the second conductive layer 53. The first conductive layer 51 and the second conductive layer 53 include respectively a polysilicon layer and a tungsten layer, thereby forming a tungsten polysilicon gate stack structure.

Particularly, the Ti/WN$_x$/WSi$_x$N$_y$/WN$_x$ intermediate structure 52 includes a first metal layer, a second metal layer, a nitrogen containing metal silicide layer, and a third metal layer. The first metal layer includes a pure metal layer, while the second and third metal layers include nitrogen containing metal layers. The nitrogen containing metal silicide layer includes a metal silicide layer containing a certain content/weight ratio of nitrogen. For instance, the first metal layer is the titanium layer 52A, and the second and third metal layers are the first and second nitrogen containing tungsten layers 52B and 52D, respectively. The metal silicide layer is the nitrogen containing tungsten silicide layer 52C.

The multiple-layered intermediate structure as illustrated above can be also formed in other various structures. For instance, the first metal layer includes a tantalum layer in addition to the titanium layer. The second and third metal layers include substantially the same material, for instance, a nitrogen containing titanium tungsten layer in addition to the nitrogen containing tungsten layer. The nitrogen containing metal silicide layer includes a nitrogen containing titanium silicide layer or a nitrogen containing tantalum silicide layer in addition to the nitrogen containing tungsten silicide layer. The tantalum layer is formed by performing a PVD method including sputtering, a CVD method or an ALD method. The nitrogen containing titanium tungsten layer is formed by performing a reactive sputter deposition method with a titanium tungsten sputter target in nitrogen gas ambient. The nitrogen containing titanium silicide layer and the nitrogen containing tantalum silicide layer are formed by a reactive sputter deposition method with respective titanium silicide and tantalum silicide sputter targets in nitrogen gas ambient. The tantalum layer is formed to a thickness of about 10 Å to 80 Å. Each of the nitrogen containing titanium tungsten layer, the nitrogen containing titanium silicide layer and the nitrogen containing tantalum silicide layer is formed to a thickness of about 20 Å to 200 Å, and has a nitrogen content ranging between about 10% and 60%. In the nitrogen containing titanium tungsten layer, a ratio of titanium to tungsten ranges from about 0.5 to 3.0. In the nitrogen containing titanium silicide layer, a ratio of silicon to titanium ranges from about 0.5 to 3.0. In the nitrogen containing tantalum silicide layer, a ratio of silicon to tantalum ranges from about 0.5 to 3.0.

Figure 6B:
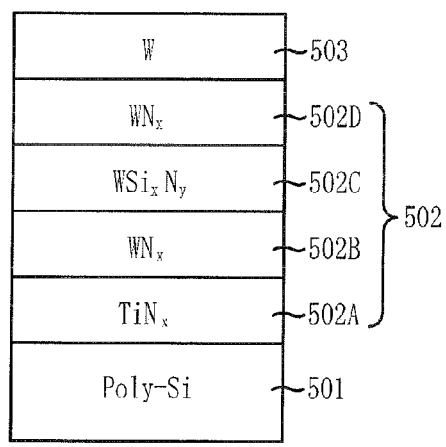
FIG. 6B illustrates a gate stack structure in accordance with an eleventh embodiment of the present invention.

FIG. 6B illustrates a gate stack structure in accordance with an eleventh embodiment of the present invention. The gate stack structure includes a first conductive layer 501, an intermediate structure 502 and a second conductive layer 503. The first conductive layer 501 includes a polysilicon layer that is highly doped with a P-type impurity such as boron or an N-type impurity such as phosphorous. The first conductive layer 501 can also include a polysilicon germanium layer (Si$_{1-x}$Ge$_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 503 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 502 includes a nitrogen containing titanium (TiN$_x$) layer 502A, a first nitrogen containing tungsten (WN$_x$) layer 502B, a nitrogen containing tungsten silicide (WSi$_x$N$_y$) layer 502C, and a second nitrogen containing tungsten (WN$_x$) layer 502D. In more detail, the nitrogen containing titanium layer 502A has a certain ratio of nitrogen to titanium, for instance, in a range of about 0.2 to 0.8, and is formed to a thickness of about 10 Å 150 Å. The nitrogen containing titanium layer 502A indicates a titanium nitride layer or a titanium layer containing a certain content/weight ratio of nitrogen.

Each of the first and second nitrogen containing tungsten layers 502B and 502D has a certain ratio of nitrogen to tungsten, for instance, in a range of about 0.3 to 1.5. The first and second nitrogen containing tungsten layers 502B and 502D each also include a tungsten nitride layer. Although described later, the first and second nitrogen containing tungsten layers 502B and 502D supply nitrogen to the nitrogen containing titanium layer 502A and the nitrogen containing tungsten silicide layer 502C. Each of the first and second nitrogen containing tungsten layers 502B and 502D is formed to a thickness of about 20 Å 200 Å. Due to the supply of nitrogen, the first and second nitrogen containing tungsten layer 502B and 502D become pure tungsten layers or tungsten layers containing a trace amount of nitrogen after the annealing.

A ratio of silicon to tungsten in the nitrogen containing tungsten silicide layer 502C ranges between about 0.5 and 3.0, and a nitrogen content of the nitrogen containing tungsten silicide layer 502C ranges from about 10% to about 60%. The nitrogen containing tungsten silicide layer 502C also includes a tungsten silicon nitride layer. The nitrogen containing tungsten silicide layer 502C has a thickness of about 20 Å to 200 Å.

The first and second nitrogen containing tungsten layers 502B and 502D are formed by performing a PVD method, a CVD method, or an ALD method. The nitrogen containing titanium layer 502A and the nitrogen containing tungsten silicide layer 502C are formed by performing a PVD method.

The PVD method proceeds with a sputter deposition method or a reactive sputter deposition method. For instance, the nitrogen containing titanium layer 502A is formed by performing a sputter deposition method with a titanium sputter target in nitrogen gas ambient. The first and second nitrogen containing tungsten layers 502B and 502D each are formed by performing a reactive sputter deposition method with a tungsten sputter target in nitrogen gas ambient. The nitrogen containing tungsten silicide layer 502C is formed by performing a reactive sputter deposition method with a tungsten silicide sputter target in nitrogen gas ambient. In particular, the PVD method such as a reactive sputter deposition method is used to form the nitrogen containing tungsten silicide layer 502C because the nitrogen containing tungsten silicide layer 502C can be formed uniformly regardless of a bottom layer type.

The gate stack structure according to the eleventh embodiment of the present invention includes the first conductive layer 501, the TiN$_x$/WN$_x$/WSi$_x$N$_y$/WN$_x$ intermediate structure 502 and the second conductive layer 503. The first conductive layer 501 includes polysilicon and the second conductive layer 503 includes tungsten, thereby forming a tungsten polysilicon gate stack structure.

Particularly, the TiN$_x$/WN$_x$/WSi$_x$N$_y$/WN$_x$ intermediate structure 502 is formed in a stack structure including a first metal layer, a second metal layer, a nitrogen containing metal silicide layer, and a third metal layer. The first, second and third metal layers are nitrogen containing metal layers, and the nitrogen containing metal silicide layer contains a certain content/weight ratio of nitrogen. For instance, the first metal layer is the nitrogen containing titanium layer 502A, and the second and third metal layers are the first and second nitrogen containing tungsten layers 502B and 502D, respectively. The metal silicide layer is the nitrogen containing tungsten silicide layer 502C.

The multiple-layered intermediate structure as illustrated above can be also formed in other various structures. For instance, the first metal layer includes a nitrogen containing tantalum (TaN$_x$) layer in addition to the nitrogen containing titanium layer. The second and third metal layers include substantially the same material, for instance, a nitrogen containing titanium tungsten (TiWN$_x$) layer in addition to the nitrogen containing tungsten layer. The nitrogen containing metal silicide layer includes a nitrogen containing titanium silicide (TiSi$_x$N$_y$) layer or a nitrogen containing tantalum silicide layer (TaSi$_x$N$_y$) in addition to the nitrogen containing tungsten silicide layer. The nitrogen containing tantalum layer is formed by performing a PVD method including sputtering, a CVD method or an ALD method. The nitrogen containing titanium tungsten layer is formed by performing a reactive sputter deposition method with a titanium tungsten sputter target in nitrogen gas ambient. The nitrogen containing titanium silicide layer and the nitrogen containing tantalum silicide layer are formed by a reactive sputter deposition method with respective titanium silicide and tantalum silicide sputter targets in nitrogen gas ambient. The nitrogen containing tantalum layer is formed to a thickness of about 10 Å to 80 Å. Each of the nitrogen containing titanium tungsten layer, the nitrogen containing titanium silicide layer and the nitrogen containing tantalum silicide layer is formed to a thickness of about 20 Å to 200 Å, and has a nitrogen content ranging between about 10% and 60%. In the nitrogen containing titanium tungsten layer, a ratio of titanium to tungsten ranges from about 0.5 to 3.0. In the nitrogen containing titanium silicide layer, a ratio of silicon to titanium ranges from about 0.5 to 3.0. In the nitrogen containing tantalum silicide layer, a ratio of silicon to tantalum ranges from about 0.5 to 3.0.

Figure 6C:
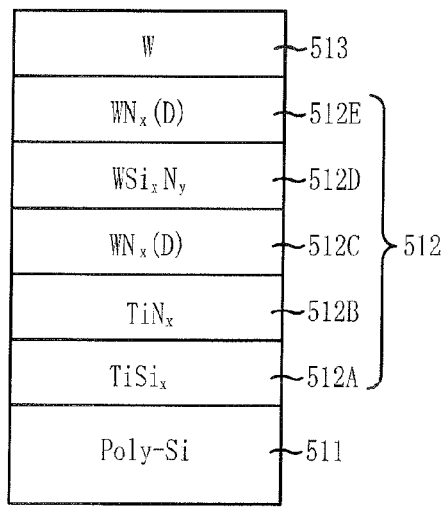
FIG. 6C illustrates a gate stack structure in accordance with a twelfth embodiment of the present invention.

FIG. 6C illustrates a gate stack structure in accordance with a twelfth embodiment of the present invention. The gate stack structure includes a first conductive layer 511, an intermediate structure 512 and a second conductive layer 513. The first conductive layer 511 includes a polysilicon layer highly doped with a P-type impurity such as boron (B) or an N-type impurity such as phosphorus (P). In addition to the polysilicon layer, the first conductive layer 511 can also include a polysilicon germanium (Si$_{1-x}$Ge$_x$) layer, where x is in a range of about 0.01 to 1.0, or a silicide layer. The silicide layer includes one selected from a group consisting of Ni, Cr, Co, Ti, W, Ta, Hf, Zr, and Pt.

The second conductive layer 513 includes a tungsten layer. The tungsten layer is formed to a thickness of about 100 Å to 2,000 Å, performing one of a PVD method, a CVD method and an ALD method. The PVD method includes a sputter deposition method with a tungsten sputter target.

The intermediate structure 512 includes a titanium silicide (TiSi$_x$) layer 512A, a nitrogen containing titanium (TiN$_x$) layer 212B, a first nitrogen containing tungsten (WN$_x$) layer 512C, a nitrogen containing tungsten silicide (WSi$_x$N$_y$) layer 512D, and a second nitrogen containing tungsten layer 512E. The intermediate structure 512 can be formed in various structure according to the selected materials described in the tenth and eleventh embodiments of the present invention.

The gate stack structure according to the twelfth embodiment is a resultant structure provided after performing an annealing treatment on the gate stack structures according to the tenth and eleventh embodiments of the present invention. The annealing includes a heat treatment accompanied during various processes (e.g., spacer formation and inter-layer insulation layer formation) performed after forming the gate stack structures.

The intermediate structure 512 is compared with the intermediate structure 52 with reference to FIGS. 6C and 6A. The titanium silicide layer 512A is formed as the titanium layer 52A reacts with polysilicon from the first conductive layer 51, and has a thickness of about 1 Å to 30 Å. A ratio of silicon to titanium in the titanium silicide layer 512A is in a range between about 0.5 and 3.0.

The nitrogen containing titanium layer 512B is provided as the titanium layer 52A is supplied with nitrogen from the titanium layer 52A. A thickness of the nitrogen containing titanium layer 512B ranges from about 10 Å to 100 Å, and has a ratio of nitrogen to titanium ranging from about 0.7 to 1.3.

After the annealing, each of the first and second nitrogen containing tungsten layers 512C and 512E has a nitrogen content decreased to about 10% or less due to the denudation. Reference symbol WN$_x$(D) denotes the denuded nitrogen containing tungsten layer. The first and second nitrogen containing tungsten layers 512C and 512E each are about 20 Å to 200 Å thick. A ratio of nitrogen to tungsten in each of the first and second nitrogen containing tungsten layers 512C and 512E is in a range between about 0.01 and 0.15.

The nitrogen containing tungsten silicide layer 512D has a thickness and a composition substantially the same as the nitrogen containing tungsten silicide layer 52C. In detail, the nitrogen containing tungsten silicide layer 512D has a ratio of silicon to tungsten ranging from about 0.5 to 3.0 and a nitrogen content of about 10% and 60%. A thickness of the nitrogen containing tungsten silicide layer 512D is in a range between about 20 Å and 200 Å.

The intermediate structure 512 is compared with the intermediate structure 502 with reference to FIGS. 6C and 6B. During the annealing treatment, the nitrogen containing titanium layer 502A is supplied with nitrogen from the nitrogen containing tungsten layer 502B. As a result, the nitrogen containing titanium layer 502A is transformed into the nitrogen containing titanium layer 512B with a minimum reaction with the titanium silicide layer 512A. A thickness of the titanium silicide layer 512A ranges from about 1 Å to 30 Å, and a thickness of the nitrogen containing titanium layer 512B ranges from about 10 Å to 100 Å. A ratio of nitrogen to titanium in the nitrogen containing titanium layer 512B ranges between about 0.7 and 1.3.

After the annealing, each of the first and second nitrogen containing tungsten layers 512C and 512E has a nitrogen content decreased to about 10% or less as the first and second nitrogen containing tungsten layers 502B and 502D are denuded. The first and second nitrogen containing tungsten layers 512C and 512E each are about 20 Å to 200 Å thick. A ratio of nitrogen to tungsten in each of the first and second nitrogen containing tungsten layers 512C and 512E is in a range between about 0.01 and 0.15.

The nitrogen containing tungsten silicide layer 512D has a thickness and a composition substantially the same as the nitrogen containing tungsten silicide layer 502C. In detail, the nitrogen containing tungsten silicide layer 512D has a ratio of silicon to tungsten ranging from about 0.5 to 3.0 and a nitrogen content of about 10% and 60%. A thickness of the nitrogen containing tungsten silicide layer 512D is in a range between about 20 Å and 200 Å.

The gate stack structure according to the twelfth embodiment includes a first intermediate structure and a second intermediate structure. The first intermediate structure includes a metal silicide layer and a first nitrogen containing metal layer, and the second intermediate structure includes a second nitrogen containing metal layer, a nitrogen containing metal silicide layer, and a third nitrogen containing metal layer. For instance, the first intermediate structure is formed by stacking the titanium silicide layer 512A and the nitrogen containing titanium layer 512B. The second intermediate structure is formed by stacking the nitrogen containing tungsten layer 512C, the nitrogen containing tungsten silicide layer 512D, and the nitrogen containing tungsten layer 512E.

Each of the intermediate structures according to the first to twelfth embodiments of the present invention includes a nitrogen containing metal silicide layer such as a nitrogen containing tungsten silicide layer and also multiple thin layers including titanium, silicon, tungsten, and nitrogen. The nitrogen containing tungsten silicide layer is formed by performing a reactive sputter deposition method with a tungsten silicide sputter target in nitrogen gas ambient. The implementation of the reactive sputter deposition method transforms the titanium layer into the titanium nitride layer while depositing the nitrogen containing tungsten silicide layer. In the case of forming the nitrogen containing tungsten layer over the titanium layer, the titanium layer is transformed into the titanium nitride layer.

Since the nitrogen containing tungsten silicide layer functions as an amorphous diffusion barrier, when the tungsten layer is formed, a specific resistance of the tungsten layer is small in a range of about 15µ Ω-cm and a large grain size. Thus, the tungsten layer has decreased sheet resistance because the tungsten layer with low specific resistance can be formed.

The gate stack structure according to the first to twelfth embodiments of the present invention has low contact resistance and reduces a polysilicon depletion because of the titanium layer or the nitrogen containing titanium layer is transformed into the titanium nitride layer when the nitrogen containing tungsten layer or the nitrogen containing tungsten silicide layer are formed. Also, the gate stack structure has low sheet resistance because of the nitrogen containing tungsten silicide layer included in each of the intermediate structures.

Because of the above transformation of the titanium layer or the titanium nitride layer into the titanium nitride layer, each of the multiple layers included in the intermediate structures includes nitrogen. As a result, the contact resistance and the sheet resistance are low, and the height of each of the gate stack structures can be reduced. In addition, it is possible to reduce a polysilicon depletion effect occurring due to the out-diffusion of impurities such as boron doped in the first conductive layer.

Figure 7A:
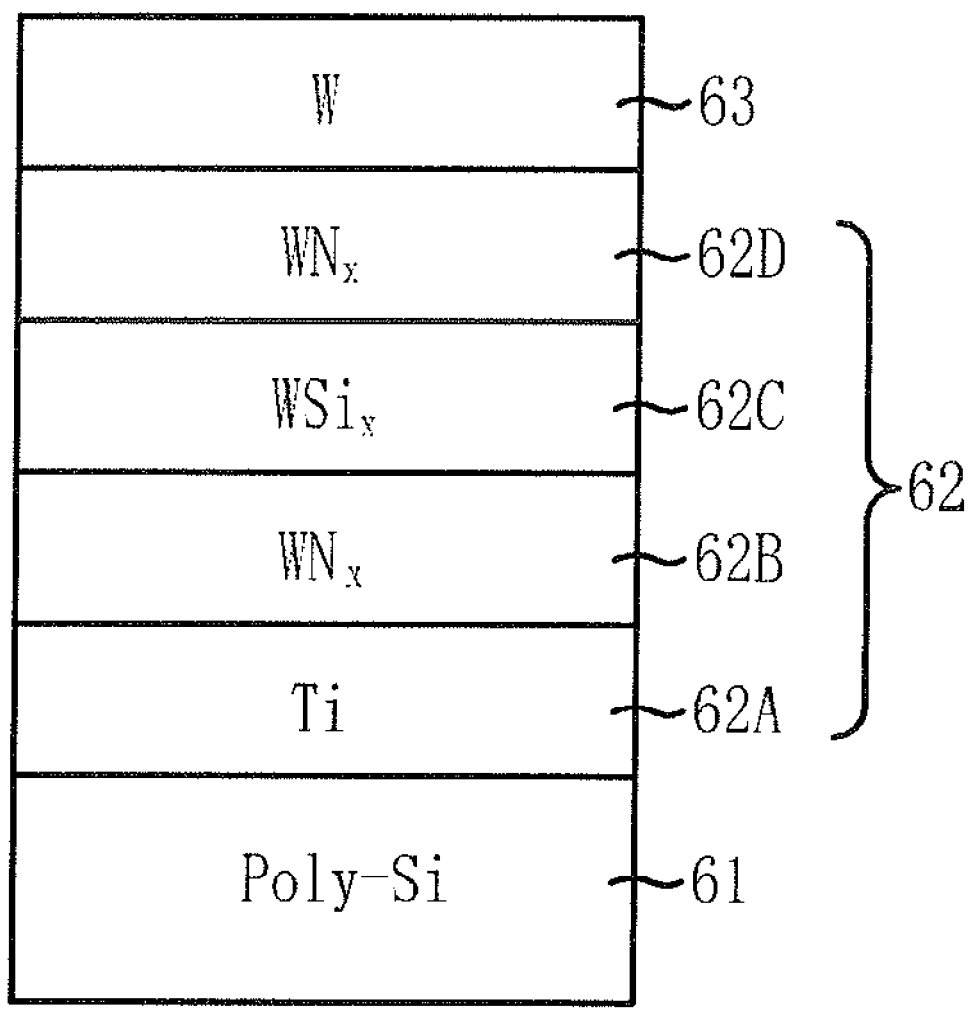
FIG. 7A illustrates a gate stack structure in accordance with a thirteenth embodiment of the present invention.

FIG. 7A illustrates a gate stack structure in accordance with a thirteenth embodiment of the present invention. The gate stack structure includes a first conductive layer 61, an intermediate structure 62 and a second conductive layer 63. The first conductive layer 61 includes a polysilicon layer that is highly doped with a P-type impurity such as boron or an N-type impurity such as phosphorous. The first conductive layer 61 can also include a polysilicon germanium layer ($Si_{1-x}Ge_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 63 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 62 includes a titanium (Ti) layer 62A, a first nitrogen containing tungsten ($WN_x$) layer 62B, a tungsten silicide ($WSi_x$) layer 62C, where x ranges between about 1.5 and 10, and a second nitrogen containing tungsten ($WN_x$) layer 62D. More specifically, the titanium layer 62A is formed to a thickness ranging from about 10 Å to 80 Å.

Each of the first and second nitrogen containing tungsten layers 62B and 62D has a certain ratio of nitrogen to tungsten, for instance, in a range of about 0.3 to 1.5. The first and second nitrogen containing tungsten layers 62B and 62D each also include a tungsten nitride layer. Although described later, the first and second nitrogen containing tungsten layers 62B and 62D have a metal property. The first and second nitrogen containing tungsten layers 62B and 62D supply nitrogen to the nitrogen containing tungsten silicide layer 62C. Each of the nitrogen containing tungsten layers 62B and 62D is formed to a thickness of about 20 Å 200 Å. Due to the supply of nitrogen, the first and second nitrogen containing tungsten layer 62B and 62D become pure tungsten layers or tungsten layers containing a trace amount of nitrogen after the annealing.

A ratio of silicon to tungsten in the nitrogen containing tungsten silicide layer 62C ranges between about 0.5 and 3.0. The nitrogen containing tungsten silicide layer 62C is formed to a thickness of about 20 Å to 100 Å.

The titanium layer 62A, the first and second nitrogen containing tungsten layers 62B and 62D, and the tungsten layer 63 are formed by performing a PVD method, a CVD method, or an ALD method. The nitrogen containing tungsten silicide layer 62C is formed by performing a PVD method.

The PVD method proceeds with a sputter deposition method or a reactive sputter deposition method. For instance, the titanium layer 62A is formed by performing a sputter deposition method with a titanium sputter target. The first and second nitrogen containing tungsten layers 62B and 62D each are formed by performing a reactive sputter deposition method with a tungsten sputter target in nitrogen gas ambient.

The nitrogen containing tungsten silicide layer 62C is formed by performing a reactive sputter deposition method with a tungsten silicide sputter target. The tungsten layer 63 is formed by a sputter deposition method with a tungsten sputter target.

The gate stack structure according to the thirteenth embodiment of the present invention includes the first conductive layer 61, the Ti/WN$_x$/WSi$_x$/WN$_x$ intermediate structure 62 and the second conductive layer 63. The first conductive layer 61 includes polysilicon and the second conductive layer 63 includes tungsten, thereby forming a tungsten polysilicon gate stack structure.

Particularly, the Ti/WN$_x$/WSi$_x$/WN$_x$ intermediate structure 62 is formed in a stack structure including a first metal layer, a second metal layer, a nitrogen containing metal silicide layer, and a third metal layer. The first metal layer includes a pure metal layer. The second and third metal layers include nitrogen containing metal layers, and the nitrogen containing metal silicide layer includes a pure tungsten silicide layer. For instance, the first metal layer is the titanium layer 62A, and the second and third metal layers are the first and second nitrogen containing tungsten layers 62B and 62D, respectively. The metal silicide layer is the nitrogen containing tungsten silicide layer 62C.

The multiple-layered intermediate structure as illustrated above can be also formed in other various structures. For instance, the first metal layer includes a tantalum layer in addition to the titanium layer. The metal silicide layer includes a titanium silicide (TiSi$_x$) layer, where x ranges between 1.5 and 10 or a tantalum silicide (TaSi$_x$) layer, where x ranges between about 1.5 and 10 in addition to the tungsten silicide layer. The second and third metal layers include a nitrogen containing titanium tungsten (TiWN$_x$) layer in addition to the nitrogen containing tungsten layer. The tantalum layer is formed by performing a PVD method including sputtering, a CVD method or an ALD method. The nitrogen containing titanium tungsten layer is formed by performing a reactive sputter deposition method with a titanium tungsten sputter target in nitrogen gas ambient. The titanium silicide layer and the tantalum silicide layer are formed by a reactive sputter deposition method with respective titanium silicide and tantalum silicide sputter targets. The tantalum layer is formed to a thickness of about 10 Å to 80 Å. The nitrogen containing titanium tungsten layer is about 20 Å to 200 Å. Each of the titanium silicide layer and the tantalum silicide layer is formed to a thickness of about 20 Å to 200 Å. The nitrogen containing titanium tungsten layer has a nitrogen content ranging between about 10% and 60%. In the nitrogen containing titanium tungsten layer, a ratio of titanium to tungsten ranges from about 0.5 to 3.0. In the titanium silicide layer, a ratio of silicon to titanium ranges from about 0.5 to 3.0. In the tantalum silicide layer, a ratio of silicon to tantalum ranges from about 0.5 to 3.0.

The tungsten silicide layer 62C formed over the first nitrogen containing tungsten layer 62B is formed by performing a PVD method such as a sputter deposition method. Performing the sputter deposition method with the tungsten silicide sputter target allows uniform formation of the tungsten silicide layer 62C regardless of a bottom layer type.

Figure 7B:
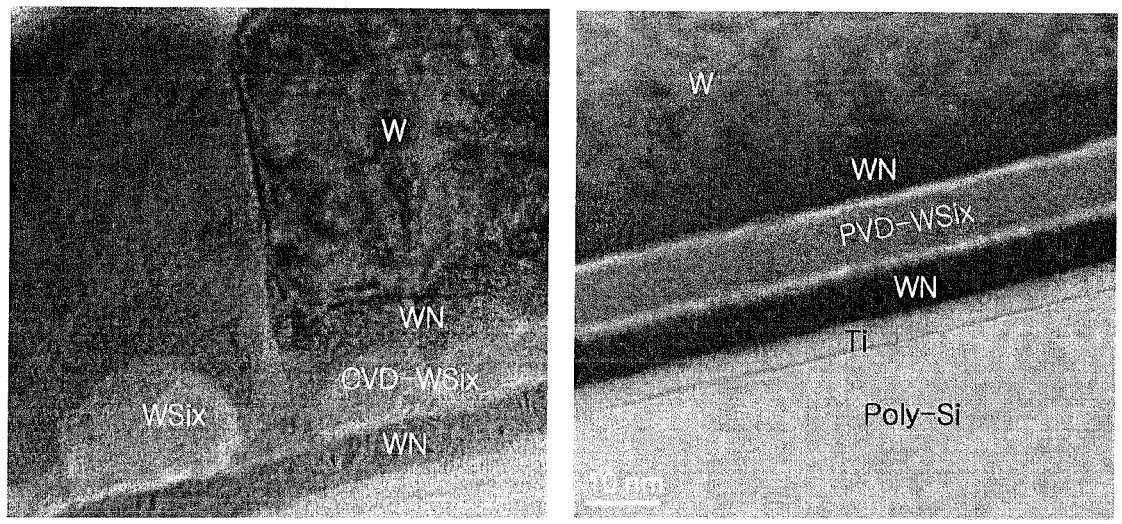
FIG. 7B illustrates images of structures provided after forming a tungsten silicide layer over a nitrogen containing tungsten layer by performing respective chemical vapor deposition (CVD) and physical vapor deposition (PVD) methods.

FIG. 7B illustrates images of structures provided after forming a tungsten silicide layer over a nitrogen containing tungsten layer by performing respective chemical vapor deposition (CVD) and physical vapor deposition (PVD) methods. While the tungsten silicide layer CVD-WSi$_x$ is not well formed over the tungsten nitride layer WN via the CVD method, the tungsten silicide layer PVD-WSi$_x$ is uniformly formed over the tungsten nitride layer WN via the PVD method. Thus, because the tungsten layer having low specific resistance can be formed over the tungsten silicide layer, the sheet resistance of the tungsten layer can be reduced.

For the gate stack structure in accordance with the thirteenth embodiment of the present invention, when the nitrogen containing tungsten layer 62B is formed over the titanium layer, the titanium layer is transformed into a titanium nitride layer.

According to the thirteenth embodiment of the present invention, since the titanium layer of the intermediate structure is transformed into the titanium nitride layer during the formation of the nitrogen containing layer, the gate stack structure can obtain low contact resistance and reduce the polysilicon depletion effect. Furthermore, since the intermediate structure includes the tungsten silicide layer, the gate stack structure can obtain low sheet resistance as well.

Figure 7C:
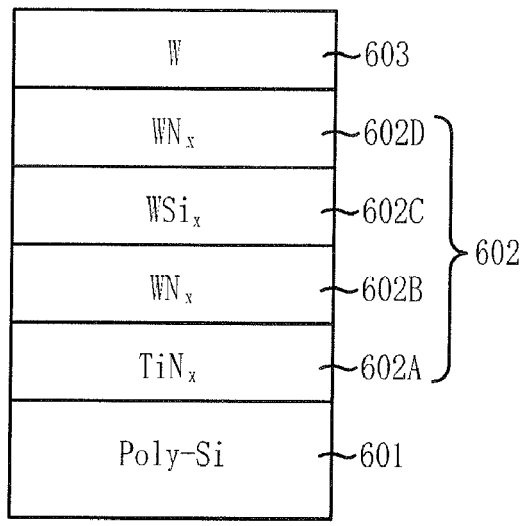
FIG. 7C illustrates a gate stack structure in accordance with a fourteenth embodiment of the present invention.

FIG. 7C illustrates a gate stack structure in accordance with a fourteenth embodiment of the present invention. The gate stack structure includes a first conductive layer 601, an intermediate structure 602 and a second conductive layer 603. The first conductive layer 601 includes a polysilicon layer that is highly doped with a P-type impurity such as boron or an N-type impurity such as phosphorous. The first conductive layer 601 can also include a polysilicon germanium layer (Si$_{1-x}$Ge$_x$, where x ranges between about 0.01 and 1.0) or a silicide layer. For instance, the silicide layer includes one selected from a group consisting of Ni, Cr, Co, Ti, W, Ta, Hf, Zr, and Pt.

The second conductive layer 603 includes a tungsten layer. The tungsten layer is about 100 Å to 2,000 Å thick, and is formed by performing a PVD method, a CVD method, or an ALD method. The PVD method includes a sputter deposition method using a tungsten sputter target.

The intermediate structure 602 includes a nitrogen containing titanium (TiN$_x$) layer 602A, a first nitrogen containing tungsten (WN$_x$) layer 602B, a tungsten silicide (WSi$_x$) layer 602C, and a second nitrogen containing tungsten (WN$_x$) layer 602D. In more detail, the nitrogen containing titanium layer 602A has a certain ratio of nitrogen to titanium, for instance, in a range of about 0.2 to 0.8, and is formed to a thickness of about 10 Å 150 Å. The nitrogen containing titanium layer 602A also includes a titanium nitride layer.

Each of the first and second nitrogen containing tungsten layers 602B and 602D has a certain ratio of nitrogen to tungsten, for instance, in a range of about 0.3 to 1.5. The first and second nitrogen containing tungsten layers 602B and 602D each also include a tungsten nitride layer. The first and second nitrogen containing tungsten layers 602B and 602D supply nitrogen to the tungsten silicide layer 602C. Each of the first and second nitrogen containing tungsten layers 602B and 602D is formed to a thickness of about 20 Å 200 Å. Due to the supply of nitrogen, the first and second nitrogen containing tungsten layer 602B and 602D become pure tungsten layers or tungsten layers containing a trace amount of nitrogen after the annealing.

A ratio of silicon to tungsten in the tungsten silicide layer 602C ranges between about 0.5 and 3.0. The tungsten silicide layer 602C has a thickness of about 20 Å to 200 Å.

The first and second nitrogen containing tungsten layers 602B and 602D are formed by performing a PVD method, a CVD method, or an ALD method. The nitrogen containing titanium layer 602A and the tungsten silicide layer 602C are formed by performing a PVD method.

The PVD method proceeds with a sputter deposition method or a reactive sputter deposition method. For instance, the nitrogen containing titanium layer 602A is formed by performing a sputter deposition method with a titanium sputter target in nitrogen gas ambient. The first and second nitrogen containing tungsten layers 602B and 602D each are formed by performing a reactive sputter deposition method with a tungsten sputter target in nitrogen gas ambient. The tungsten silicide layer 502C is formed by performing a reactive sputter deposition method with a tungsten silicide sputter target. The tungsten layer 603 is formed by a sputter deposition method with a tungsten sputter target. The gate stack structure according to the fourteenth embodiment of the present invention includes the first conductive layer 601, the $TiN_x/WN_x/WSi_x/WN_x$ intermediate structure 602 and the second conductive layer 603. The first conductive layer 601 includes polysilicon and the second conductive layer 603 includes tungsten, thereby forming a tungsten polysilicon gate stack structure.

Particularly, the $TiN_x/WN_x/WSi_x/WN_x$ intermediate structure 602 is formed in a stack structure including a first metal layer, a second metal layer, a metal silicide layer, and a third metal layer. The first, second and third metal layers are nitrogen containing metal layers, and the metal silicide layer is a pure metal silicide layer. For instance, the first metal layer is the nitrogen containing titanium layer 602A, and the second and third metal layers are the first and second nitrogen containing tungsten layers 602B and 602D, respectively. The metal silicide layer is the tungsten silicide layer 602C.

The multiple-layered intermediate structure as illustrated above can be also formed in other various structures. For instance, the first metal layer includes a nitrogen containing tantalum ($TaN_x$) layer in addition to the nitrogen containing titanium layer. In addition to the tungsten silicide layer, the metal silicide layer includes a titanium silicide ($TiSi_x$) layer, where x ranges between about 1.5 and 10 or a tantalum silicide ($TaSi_x$) layer, where x ranges between about 1.5 to 10. The second and third metal layers include a nitrogen containing titanium tungsten ($TiWN_x$) layer in addition to the nitrogen containing tungsten layer. The nitrogen containing tantalum layer is formed by performing a reactive sputtering method with a tantalum sputter target in nitrogen gas ambient. The nitrogen containing titanium tungsten layer is formed by performing a reactive sputter deposition method with a titanium tungsten sputter target in nitrogen gas ambient. The titanium silicide layer and the tantalum silicide layer are formed by a reactive sputter deposition method with respective titanium silicide and tantalum silicide sputter targets. The nitrogen containing tantalum layer is formed to a thickness of about 10 Å to 150 Å. Each of the nitrogen containing titanium tungsten layer, the titanium silicide layer and the tantalum silicide layer is formed to a thickness of about 20 Å to 200 Å. A nitrogen content within the nitrogen containing titanium tungsten layer ranges between about 10% and 60%. In the nitrogen containing titanium tungsten layer, a ratio of titanium to tungsten ranges from about 0.5 to 3.0. In the titanium silicide layer, a ratio of silicon to titanium ranges from about 0.5 to 3.0. In the tantalum silicide layer, a ratio of silicon to tantalum ranges from about 0.5 to 3.0.

In the intermediate structure 602 described above, the tungsten silicide layer 602C formed over the first nitrogen containing tungsten layer 602B is formed by a PVD method such as a sputter deposition method. Performing the sputter deposition method with the tungsten silicide sputter target allows the uniform formation of the tungsten silicide layer 602C regardless of a bottom layer type.

Figure 7D:
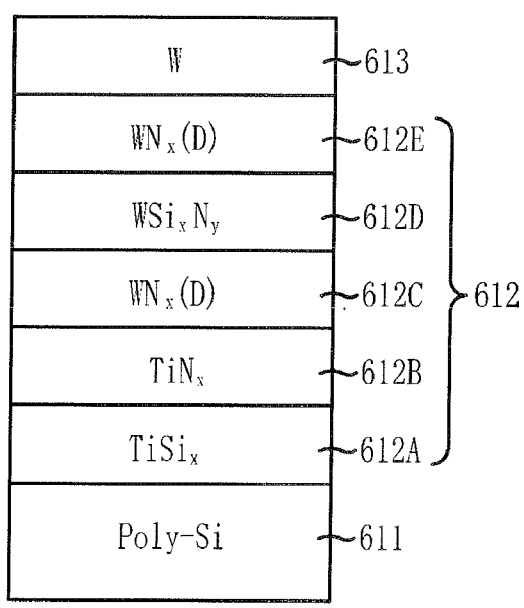
FIG. 7D illustrates a gate stack structure in accordance with a fifteenth embodiment of the present invention.

FIG. 7D illustrates a gate stack structure in accordance with a fifteenth embodiment of the present invention. The gate stack structure includes a first conductive layer 611, an intermediate structure 612 and a second conductive layer 613. The first conductive layer 611 includes a polysilicon layer highly doped with a P-type impurity such as boron (B) or an N-type impurity such as phosphorus (P). In addition to the polysilicon layer, the first conductive layer 611 can also include a polysilicon germanium ($Si_{1-x}Ge_x$) layer, where x is in a range of about 0.01 to 1.0, or a silicide layer. The silicide layer includes one selected from a group consisting of Ni, Cr, Co, Ti, W, Ta, Hf, Zr, and Pt.

The second conductive layer 613 includes a tungsten layer. The tungsten layer is formed to a thickness of about 100 Å to 2,000 Å, performing one of a PVD method, a CVD method and an ALD method. The PVD method includes a sputter deposition method with a tungsten sputter target.

The intermediate structure 612 includes a titanium silicide ($TiSi_x$) layer 612A, a nitrogen containing titanium ($TiN_x$) layer 612B, a first nitrogen containing tungsten ($WN_x$) layer 612C, a nitrogen containing tungsten silicide ($WSi_xN_y$) layer 612D, and a second nitrogen containing tungsten layer 612E. The intermediate structure 612 can be formed in various structure according to the selected materials described in the thirteenth and fourteenth embodiments of the present invention.

The gate stack structure according to the fifteenth embodiment of the present invention is a resultant structure provided after performing an annealing treatment on the gate stack structures according to the thirteenth and fourteenth embodiments of the present invention. The annealing includes a heat treatment accompanied during various processes (e.g., spacer formation and inter-layer insulation layer formation) performed after forming the gate stack structures.

The intermediate structure 612 is compared with the intermediate structure 62 with reference to FIGS. 7D and 7A. The titanium silicide layer 612A is formed as the titanium layer 62A reacts with polysilicon from the first conductive layer 61, and has a thickness of about 1 Å to 30 Å. A ratio of silicon to titanium in the titanium silicide layer 612A is in a range between about 0.5 and 3.0.

The nitrogen containing titanium layer 612B is provided as the titanium layer 62A is supplied with nitrogen from the titanium layer 62A. A thickness of the nitrogen containing titanium layer 612B ranges from about 10 Å to 100 Å, and has a ratio of nitrogen to titanium ranging from about 0.6 to 1.2

After the annealing, each of the first and second nitrogen containing tungsten layers 612C and 612E has a nitrogen content decreased to about 10% or less due to the denudation. Reference symbol $WN_x(D)$ denotes the denuded nitrogen containing tungsten layer. The first and second nitrogen containing tungsten layers 612C and 612E each are about 20 Å to 200 Å thick. A ratio of nitrogen to tungsten in each of the first and second nitrogen containing tungsten layers 612C and 612E is in a range between about 0.01 and 0.15.

As nitrogen from the first and second nitrogen containing tungsten layers 602B and 602D is decomposed, the tungsten silicide layer 602C is transformed into the nitrogen containing tungsten silicide layer 612D. A ratio of silicon to tungsten within the nitrogen containing tungsten silicide layer 612D ranges from about 0.5 to 3.0. The nitrogen containing tungsten silicide layer 612D has a nitrogen content of about 10% and 60% and a thickness of about 20 Å and 200 Å.

The intermediate structure 612 is compared with the intermediate structure 602 with reference to FIGS. 7D and 7C. During the annealing treatment, the nitrogen containing titanium layer 602A is supplied with nitrogen from the nitrogen containing tungsten layer 602B. As a result, the nitrogen containing titanium layer 602A is transformed into the nitrogen containing titanium layer 612B with a minimum reaction with the titanium silicide layer 612A. A thickness of the titanium silicide layer 612A ranges from about 1 Å to 30 Å, and a thickness of the nitrogen containing titanium layer 612B ranges from about 10 Å to 100 Å. A ratio of nitrogen to titanium in the nitrogen containing titanium layer 612B ranges between about 0.7 and 1.3.

After the annealing, each of the first and second nitrogen containing tungsten layers 612C and 612E has a nitrogen content decreased to about 10% or less as the first and second nitrogen containing tungsten layers 602B and 602D are denuded. The first and second nitrogen containing tungsten layers 612C and 612E each are about 20 Å to 200 Å thick. A ratio of nitrogen to tungsten in each of the first and second nitrogen containing tungsten layers 612C and 612E is in a range between about 0.01 and 0.15.

As nitrogen from the first and second nitrogen containing tungsten layers 602B and 602D, the tungsten silicide layer 602C is transformed into the nitrogen containing tungsten silicide layer 612D. The nitrogen containing tungsten silicide layer 612D has a ratio of silicon to tungsten ranging from about 0.5 to 3.0 and a nitrogen content of about 10% and 60%. A thickness of the nitrogen containing tungsten silicide layer 512D is in a range between about 20 Å and 200 Å.

The gate stack structure according to the fifteenth embodiment includes a first intermediate structure and a second intermediate structure. The first intermediate structure includes a metal silicide layer and a first nitrogen containing metal layer, and the second intermediate structure includes a second nitrogen containing metal layer, a nitrogen containing metal silicide layer, and a third nitrogen containing metal layer. For instance, the first intermediate structure is formed by stacking the titanium silicide layer 612A and the nitrogen containing titanium layer 612B. The second intermediate structure is formed by stacking the nitrogen containing tungsten layer 612C, the nitrogen containing tungsten silicide layer 612D, and the nitrogen containing tungsten layer 612E.

The intermediate structures according to the first to fifteenth embodiments of the present invention can be implemented to control gate electrodes of flash memory devices and gate electrodes of numerous logic devices in addition to dynamic random access memory (DRAM) devices.

Figure 8:
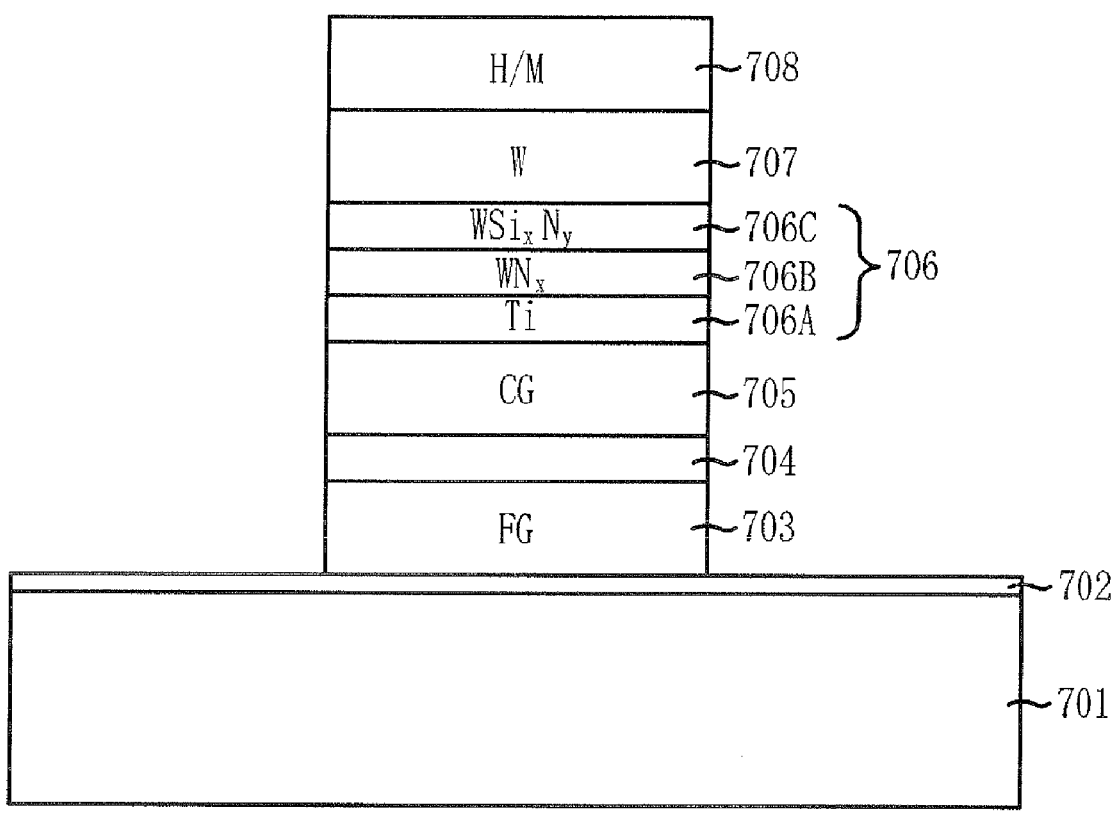
FIG. 8 illustrates a gate stack structure in accordance with a sixteenth embodiment of the present invention.

FIG. 8 illustrates a gate stack structure of a flash memory device in accordance with a sixteenth embodiment of the present invention. A tunnel oxide layer 702 corresponding to a gate insulation layer is formed over a substrate 701. A first polysilicon electrode 703 for a floating gate FG is formed over the tunnel oxide layer 702.

A dielectric layer 704 is formed over the first polysilicon electrode 703, and a second polysilicon electrode 705 for a control gate CG is formed over the dielectric layer 704.

An intermediate structure 706 selected from a group consisting of the various types of the intermediate structures described in the first to fifteenth embodiments of the present invention is formed over the second polysilicon electrode 205. The intermediate structure 706 includes a Ti/WN$_x$/WSi$_x$N$_y$ intermediate structure according to the first embodiment of the present invention. Accordingly, the intermediate structure 706 is formed by sequentially stacking a titanium layer 706A, a nitrogen containing tungsten layer 706B, and a nitrogen containing tungsten silicide layer 706C.

A tungsten electrode 707 and a hard mask 208 are formed over the intermediate structure 706. Reference letters W and H/M represent the tungsten electrode 707 and the hard mask 208, respectively.

The gate stack structure of the flash memory device having the intermediate structure 706 shown in FIG. 8 has low sheet resistance and contact resistance. This embodiment of the present invention can be applied to various metal interconnections such as a bit line, a metal line, and a capacitor electrode including an intermediate structure in addition to the gate electrode. Furthermore, this embodiment of the present invention can be applied to a gate stack structure of a semiconductor device forming a dual polysilicon gate comprising of a first gate stack structure (including a polysilicon electrode doped with an N-type impurity formed underneath an intermediate structure, and a tungsten electrode formed over the intermediate structure) and a second gate stack structure (including a polysilicon electrode doped with a P-type impurity and a tungsten electrode formed over the intermediate structure).

Figure 9:
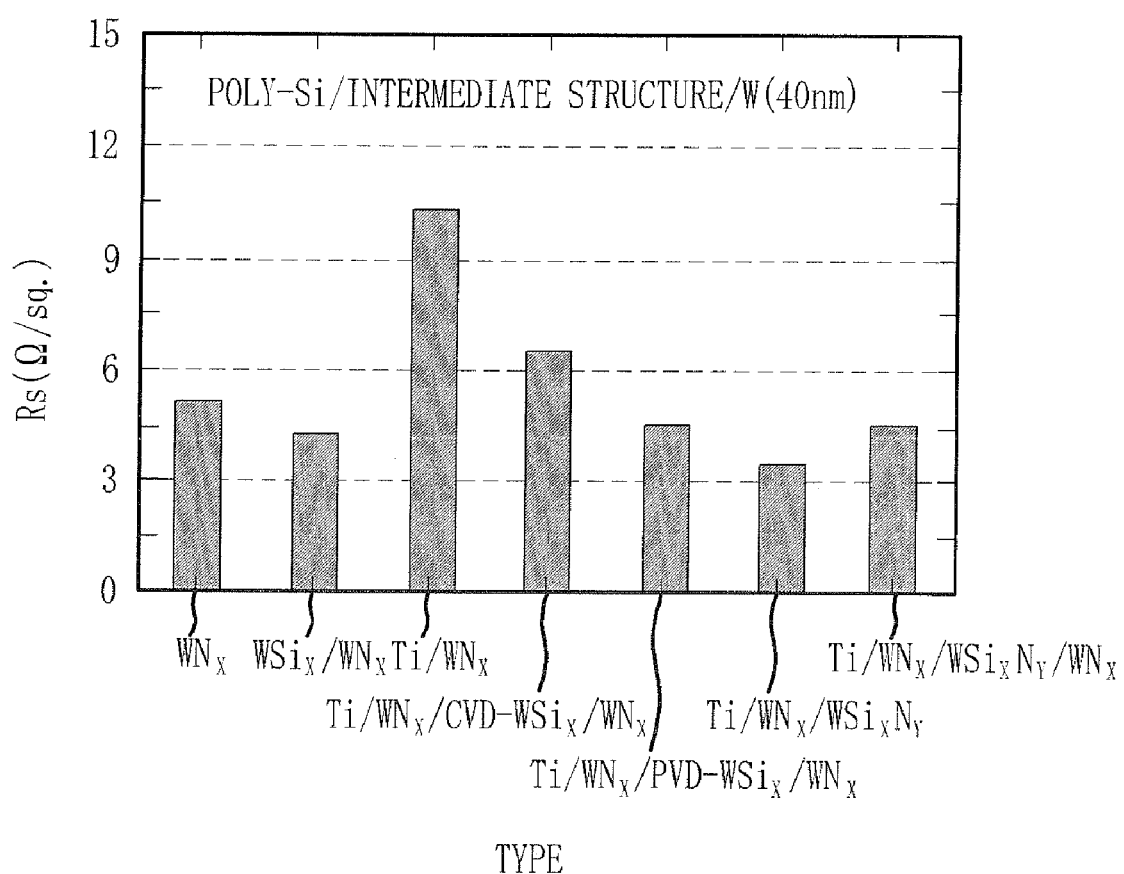
FIG. 9 is a graph illustrating sheet resistance of a tungsten electrode for each type of intermediate structure in accordance with an embodiment of the present invention.

FIG. 9 is a graph illustrating sheet resistance (Rs) of a tungsten layer for each type of intermediate structure formed in accordance with the first to fifteenth embodiments of the present invention. The tungsten layer has a thickness of about 40 nm.

It can be observed that the sheet resistance of the tungsten electrode is reduced in the cases of additionally applying WSi$_x$/WN$_x$ intermediate structures via a CVD method and a PVD method, (i.e., a Ti/WN$_x$/CVD-WSi$_x$/WN$_x$ structure and a Ti/WN$_x$/PVD-WSi$_x$/WN$_x$ structure), and a WSi$_x$N$_y$ layer, (i.e., a Ti/WN$_x$/WSi$_x$N$_y$ structure) over a Ti/WN$_x$ intermediate structure. However, since a WSi$_x$ layer cannot grow well over a WN$_x$ layer via a CVD method, the WSi$_x$ layer needs to be formed over the WN$_x$ layer via a PVD method such as a sputter deposition method. The formation of the WSi$_x$N$_y$ layer is performed via a reactive sputter deposition method using a tungsten silicide sputter target and nitrogen gas.

The sheet resistance of the tungsten electrode for the Ti/WN$_x$/CVD-WSi$_x$/WN$_x$ intermediate structure, the Ti/WN$_x$/PVD-WSi$_x$/WN$_x$ intermediate structure, and the Ti/WN$_x$/WSi$_x$N$_y$ intermediate structure will be compared. The sheet resistance of the tungsten electrode is low only in the cases of applying the Ti/WN$_x$/PVD-WSi$_x$/WN$_x$ intermediate structure, and the Ti/WN$_x$/WSi$_x$N$_y$ intermediate structure is the same as in the case of applying a WSi$_x$/WN$_x$ intermediate structure. In the case of applying the WSi$_x$ layer via the CVD method, the WSi$_x$ layer is not uniformly formed over the WN$_x$ layer. As a result, agglomeration is generated over the WN$_x$ layer, thereby increasing the sheet resistance. On the contrary, if the sputter deposition method using the WSi$_x$ sputter target or the reactive sputter deposition method is used, the WSi$_x$ diffusion layer can be uniformly formed, thereby reducing the sheet resistance of the tungsten electrode.

Figure 10A:
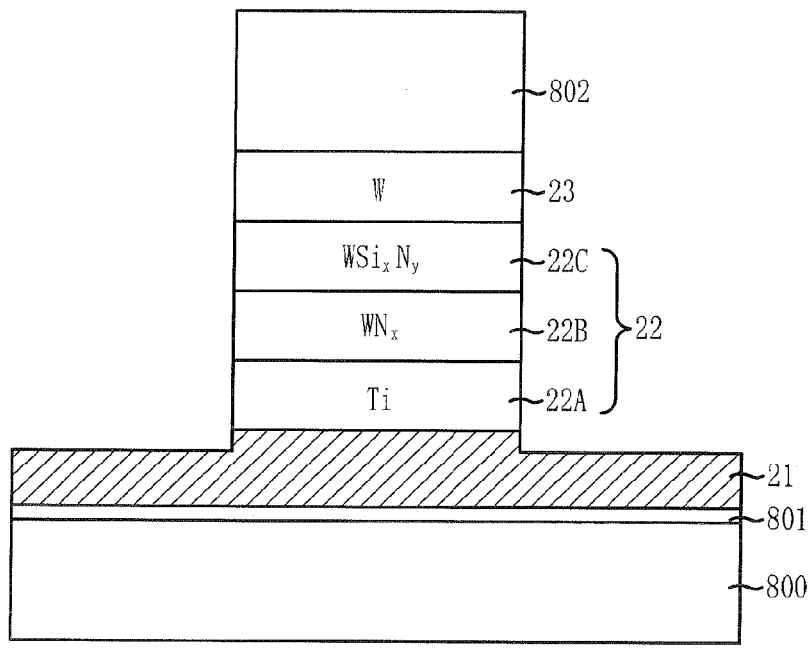
FIGS. 10A to 10C are cross-sectional views illustrating a gate patterning method to obtain the gate stack structure illustrated in FIG. 3A in accordance with an embodiment of the present invention.
Figure 10B:
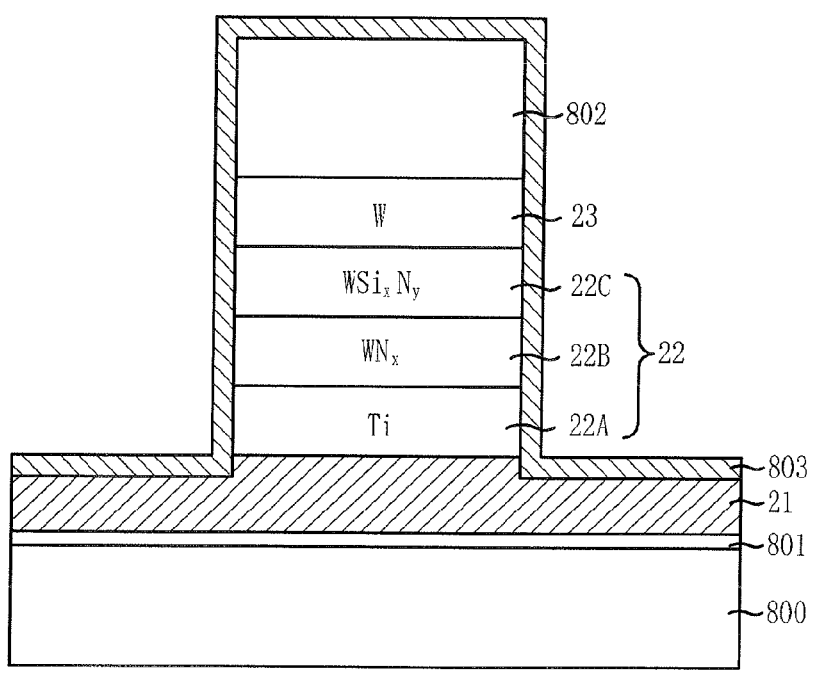
Figure 10C:
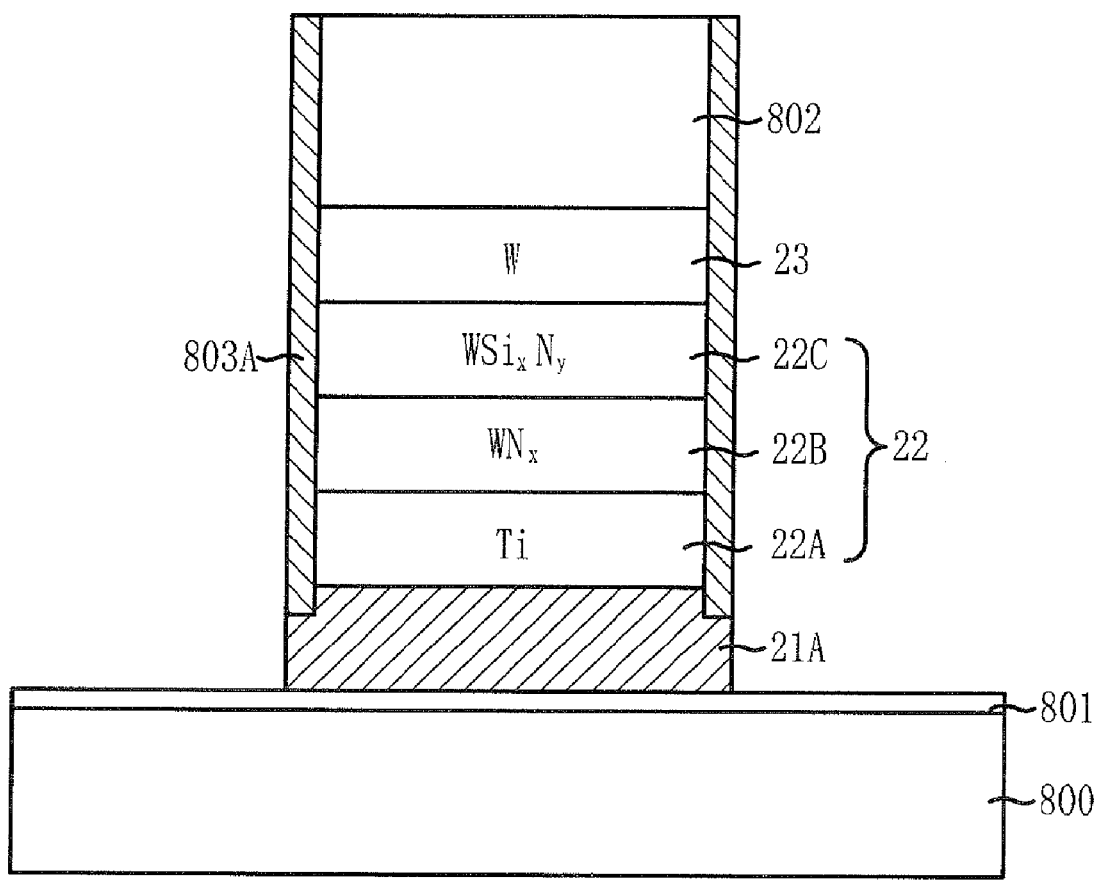

FIGS. 10A to 10C illustrate a gate patterning process using the gate stack structure shown in FIG. 3A. The same reference numerals identified in FIG. 3A represent the same elements herein.

Referring to FIG. 10A, a gate insulation layer 801 is formed over a substrate 800 in which an ion-implantation process is performed to form an isolation layer, a well and a channel.

A patterned first conductive layer 21 is formed over the gate insulation layer 801. An intermediate structure 22 is formed over the patterned first conductive layer 21. A patterned second conductive layer 23 is formed over the intermediate structure 22.

The patterned first conductive layer 21 includes a polysilicon layer that is highly doped with a P-type impurity such as boron or an N-type impurity such as phosphorous. The patterned first conductive layer 21 can also include a polysilicon germanium layer ($Si_{1-x}Ge_x$, where x ranges between about 0.01 and 1.0) or a silicide layer. For instance, the silicide layer includes one selected from a group consisting of Ni, Cr, Co, Ti, W, Ta, Hf, Zr, and Pt.

The intermediate structure 22 includes a patterned titanium (Ti) layer 22A, a patterned nitrogen containing tungsten (WN$_x$) layer 22B, and a patterned nitrogen containing tungsten silicide (WSi$_x$N$_y$) layer 22C.

The patterned second conductive layer 23 includes a tungsten layer. The tungsten layer is formed by performing a PVD method, a CVD method, or an ALD method. The PVD method includes a sputter deposition method using a tungsten sputter target.

A hard mask 802 is formed over the patterned second conductive layer 23. The formation of the hard mask 802 can be omitted. The hard mask 802 includes silicon nitride (Si$_3$N$_4$).

A gate patterning process is performed to form the illustrated gate stack structure. Particularly, although not shown, a first pattering process is performed to etch a hard mask layer, a second conductive layer, multiple layers of a titanium layer, a nitrogen containing tungsten layer, and a nitrogen containing tungsten silicide layer for the intermediate structure 22, and a portion of a first conductive layer using an etch barrier gate mask (not shown) formed from a photoresist layer. As a result, the structure including the hard mask 802, the patterned second conductive layer 23, the intermediate structure 22, and the patterned first conductive layer 21 is formed over the gate insulation layer 801 and the substrate 800.

Referring to FIG. 10B, the gate mask is removed and then, a pre-spacer process is performed to prevent a non-uniform etch and an oxidation of the patterned second conductive layer 23 (i.e., tungsten layer) and the intermediate structure 22. For instance, a Si$_3$N$_4$ layer 803 is formed as a pre-spacer layer.

Referring to FIG. 10C, a second gate patterning process is performed to etch the Si$_3$N$_4$ layer 803 and a portion of the patterned first conductive layer 21. During the second gate patterning process, a portion of the Si$_3$N$_4$ layer 803 is etched using a dry etching method to form spacers 803A on the sidewalls of the gate stack structure. The patterned first conductive layer 21 is etched using the spacers 103A as an etch barrier. Reference numeral 21A identifies an electrode (e.g., polysilicon electrode).

The first and second gate patterning process using the pre-spacer layer as described above can be applied to the gate stack structures in accordance with the second to fifteenth embodiments of the present invention.

Figure 11:
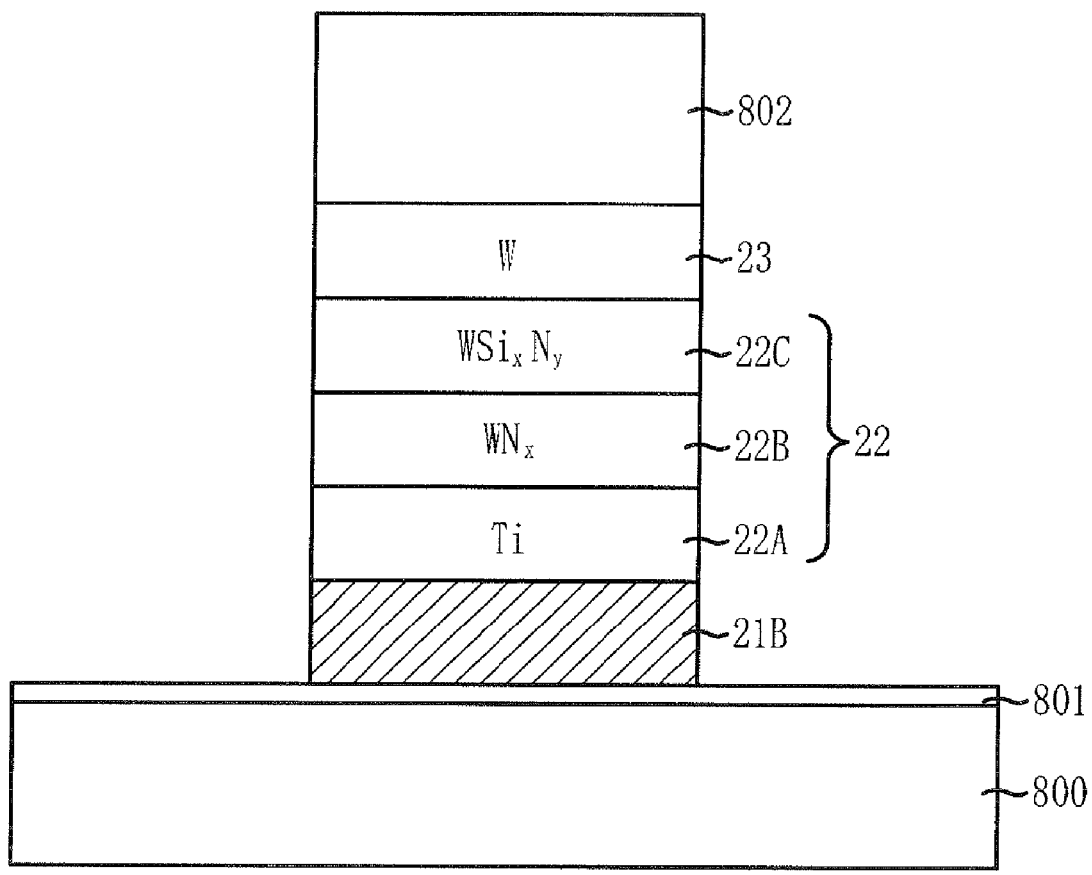
FIG. 11 is a cross-sectional view illustrating a gate patterning method using the gate stack structure illustrated in FIG. 3A.

FIG. 11 illustrates another gate patterning process using the gate stack structure shown in FIG. 3A. The same reference numerals used in FIGS. 10A to 10C identify the same elements herein.

A gate insulation layer 801 is formed over a substrate 800 in which an ion-implantation process is performed to form an isolation layer, a well and a channel. A patterned first conductive layer 21B is formed over the gate insulation layer 801. An intermediate structure 22 is formed over the patterned first conductive layer 21B. A patterned second conductive layer 23 is formed over the intermediate structure 22.

The patterned first conductive layer 21B includes a polysilicon layer that is highly doped with a P-type impurity such as boron or an N-type impurity such as phosphorous. The patterned first conductive layer 21B can also include a polysilicon germanium layer (Si$_{1-x}$Ge$_x$, where x ranges between about 0.01 and 1.0) or a silicide layer. For instance, the silicide layer includes one selected from a group consisting of Ni, Cr, Co, Ti, W, Ta, Hf, Zr, and Pt.

The intermediate structure 22 includes a patterned titanium (Ti) layer 22A, a patterned nitrogen containing tungsten (WN$_x$) layer 22B, and a patterned nitrogen containing tungsten silicide (WSi$_x$N$_y$) layer 22C.

The patterned second conductive layer 23 includes a tungsten layer. The tungsten layer is formed by performing a PVD method, a CVD method, or an ALD method. The PVD method includes a sputter deposition method using a tungsten sputter target.

A hard mask 802 is formed over the patterned second conductive layer 23. The formation of the hard mask 802 can be omitted. The hard mask 802 includes silicon nitride (Si$_3$N$_4$). A gate patterning process is performed to form the illustrated gate stack structure. Particularly, although not shown, a hard mask layer, a second conductive layer, multiple layers of a titanium layer, a nitrogen containing tungsten layer, and a nitrogen containing tungsten silicide layer for the intermediate structure 22, and a portion of a first conductive layer are etched simultaneously using an etch barrier gate mask (not shown) formed from a photoresist layer. As a result, the structure including the hard mask 802, the patterned second conductive layer 23, the intermediate structure 22, and the patterned first conductive layer 21B is formed over the gate insulation layer 801 and the substrate 800. Instead of a gate patterning process comprised of two steps using a pre-spacer layer, the gate patterning process which performs etching at once without using the pre-spacer layer is selected. The gate patterning process performed without using the pre-spacer layer can be applied to the gate stack structures in accordance with the second to fifteenth embodiments of the present invention.

According to the embodiments of the present invention, an intermediate structure comprised of multiple thin layers including Ti, W, Si, and N or each including N disposed between a tungsten electrode and a polysilicon electrode makes it possible to obtain sheet resistance as low as those of poly-Si/WN$_x$/W and poly-Si/WN$_x$/WSi$_x$/W intermediate structures. Accordingly, the height of a gate stack structure can be reduced, thereby easily obtaining process integration.

A polysilicon depletion effect can be reduced due to a reduction in a boron penetration or a boron out-diffusion and thus, an operation current of a PMOSFET can be increased. Furthermore, very low contact resistance can be obtained between the tungsten electrode and the polysilicon electrode, thereby providing an advantage in the fabrication of high-speed devices.

As for a method for forming a tungsten polysilicon gate employed to fabricate high-speed, high-density, and low power memory devices, low sheet resistance, low contact resistance and a low polysilicon depletion effect can be obtained by implementing an intermediate structure comprised of multiple thins films including Ti, W, Si, and N, or each including N.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a first conductive layer;
   an intermediate structure formed over the first conductive layer and including at least a first metal layer, a nitrogen containing metal silicide layer, and a second metal layer interposed between the first metal layer and the nitrogen containing metal silicide layer, wherein the first metal layer comprises a pure metal layer and the second metal layer comprises one of a nitrogen containing tungsten layer and a nitrogen containing titanium layer; and
   a second conductive layer formed over the intermediate structure.

2. The semiconductor device of claim 1, wherein the second metal layer has an atomic ratio of nitrogen to metal ranging between about 0.3 and 1.5.

3. The semiconductor device of claim 1, wherein the pure metal layer comprises one of a titanium layer and a tantalum layer.

4. The semiconductor device of claim 1, wherein the pure metal layer is formed to a thickness of about 10 Å to 80 Å.

5. The semiconductor device of claim 1, wherein the nitrogen containing metal silicide layer is formed by performing a reactive sputter deposition method with a metal silicide sputter target in nitrogen gas ambient.

6. The semiconductor device of claim 5, wherein the metal silicide sputter target comprises one selected from a group consisting of a tungsten silicide sputter target, a titanium silicide sputter target, and a tantalum silicide sputter target.

7. The semiconductor device of claim 6, wherein the nitrogen containing metal silicide layer has a nitrogen content of about 10% to 60% and an atomic ratio of silicon to metal ranging from about 0.5 to 3.0.

8. The semiconductor device of claim 1, wherein the first conductive layer comprises one selected from a polysilicon layer, a polysilicon germanium layer and a silicide layer and the second conductive layer comprises tungsten.

9. The semiconductor device of claim 8, wherein the polysilicon layer is doped with a P-type impurity.

10. The semiconductor device of claim 1, wherein the first conductive layer comprises a polysilicon layer doped with an N-type impurity and another polysilicon layer doped with a P-type impurity, thereby providing a dual polysilicon gate stack structure.

11. The semiconductor device of claim 1, further comprising a floating gate overlying the substrate, a dielectric layer overlying the floating gate, and a control gate overlying the dielectric layer, wherein the control gate is the first conductive layer.

* * * * *